US012235595B2

(12) United States Patent
Rodak

(10) Patent No.: US 12,235,595 B2
(45) Date of Patent: Feb. 25, 2025

(54) SYSTEMS FOR CLEANING A PORTION OF A LITHOGRAPHY APPARATUS

(71) Applicant: ASML HOLDING N.V., Veldhoven (NL)

(72) Inventor: Daniel Paul Rodak, Milford, CT (US)

(73) Assignee: ASML HOLDING N.V., Veldhoven (NL)

(*) Notice: Subject to any disclaimer, the term of this patent is extended or adjusted under 35 U.S.C. 154(b) by 456 days.

(21) Appl. No.: 17/771,044

(22) PCT Filed: Oct. 20, 2020

(86) PCT No.: PCT/EP2020/079526
§ 371 (c)(1),
(2) Date: Apr. 22, 2022

(87) PCT Pub. No.: WO2021/089320
PCT Pub. Date: May 14, 2021

(65) Prior Publication Data
US 2022/0390860 A1    Dec. 8, 2022

Related U.S. Application Data

(60) Provisional application No. 62/931,864, filed on Nov. 7, 2019.

(51) Int. Cl.
*G03F 7/00*    (2006.01)
*B08B 1/14*    (2024.01)
(Continued)

(52) U.S. Cl.
CPC .......... *G03F 7/70925* (2013.01); *B08B 1/143* (2024.01); *B08B 7/0028* (2013.01);
(Continued)

(58) Field of Classification Search
CPC ............. G03F 7/70925; G03F 7/70733; G03F 7/70808; G03F 7/70741
See application file for complete search history.

(56) References Cited

U.S. PATENT DOCUMENTS 6,046,792 A     4/2000   Van Der Werf et al.
6,961,116 B2   11/2005   Den Boef et al.
(Continued)

FOREIGN PATENT DOCUMENTS

CN    101364041      2/2009
JP    2002050667     2/2002
(Continued)

OTHER PUBLICATIONS

Machine translation of JP-2009147209-A (Year: 2009).*
(Continued)

*Primary Examiner* — Steven H Whitesell
(74) *Attorney, Agent, or Firm* — Pillsbury Winthrop Shaw Pittman, LLP

(57) ABSTRACT

A cleaning tool configured to be inserted into a lithography apparatus in a first configuration, configured to be engaged by a handler of the lithography apparatus, and used for cleaning a portion of the lithography apparatus. The cleaning tool is configured to move from the first configuration to a second, expanded configuration, after engagement by the handler such that the cleaning tool is in the second configuration when used for cleaning the portion of the lithography apparatus. There may also be a container configured to hold the cleaning tool in the first configuration and fit into the lithography apparatus. In that case, the cleaning tool is configured to be inserted into the lithography apparatus in the container, moved from the container by the handler for the cleaning, and returned to the container by the handler after the cleaning.

20 Claims, 16 Drawing Sheets

(51) Int. Cl.
    *B08B 7/00*       (2006.01)
    *B08B 13/00*      (2006.01)
(52) U.S. Cl.
    CPC .......... *B08B 13/00* (2013.01); *G03F 7/70733* (2013.01); *G03F 7/70808* (2013.01)

(56) References Cited

U.S. PATENT DOCUMENTS

| | | | |
|---|---|---|---|
| 9,588,438 | B2 | 3/2017 | Hsu et al. |
| 2002/0020751 | A1* | 2/2002 | Matsumoto ............ G03F 7/7075 235/487 |
| 2006/0022049 | A1 | 2/2006 | Liu et al. |
| 2006/0066855 | A1 | 3/2006 | Boef et al. |
| 2010/0186768 | A1 | 7/2010 | Kanamitsu |
| 2011/0027704 | A1 | 2/2011 | Cramer et al. |
| 2011/0027724 | A1 | 2/2011 | Tanaka |
| 2011/0043791 | A1 | 2/2011 | Smilde et al. |
| 2011/0159440 | A1* | 6/2011 | Nakajima .............. B82Y 10/00 430/311 |
| 2012/0242970 | A1 | 9/2012 | Smilde et al. |
| 2014/0268074 | A1 | 9/2014 | Chien et al. |
| 2015/0241797 | A1 | 8/2015 | Onvlee et al. |

FOREIGN PATENT DOCUMENTS

| | | | |
|---|---|---|---|
| JP | 2005072404 | | 3/2005 |
| JP | 2006013308 | | 1/2006 |
| JP | 2009147209 | A * | 7/2009 |
| JP | 2009147227 | | 7/2009 |
| JP | 2009147227 | A * | 7/2009 |
| JP | 2010087156 | | 4/2010 |
| JP | 2014138041 | | 7/2014 |
| JP | 2015029922 | | 2/2015 |
| JP | 2015531890 | | 11/2015 |
| JP | 2017191286 | | 10/2017 |
| TW | 201640230 | | 11/2016 |
| WO | 2007074757 | | 7/2007 |
| WO | 2009078708 | | 6/2009 |
| WO | 2009106279 | | 9/2009 |
| WO | 2009116625 | | 9/2009 |
| WO | 2020094388 | | 5/2020 |

OTHER PUBLICATIONS

Machine translation of JP-2009147227-A (Year: 2009).*
Office Action issued in corresponding Japanese Patent Application No. 2023-159343, dated Jul. 16, 2024.
Office Action issued in corresponding Korean Patent Application No. 10-2022-7015374, dated Aug. 8, 2024.
International Search Report and Written Opinion issued in corresponding PCT Patent Application No. PCT/EP2020/079526, dated Feb. 26, 2021.
Taiwanese Office Action issued in corresponding Taiwanese Patent Application No. 109138563, dated Aug. 4, 2021.
Anonymous, "Research Disclosure", Research Disclosure, vol. 570, No. 4 (Oct. 1, 2011).
Anonymous, "Systems and Methods for Cleaning a Portion of a Lithography Apparatus", Research Disclosure, vol. 679, No. 54 (Oct. 6, 2020).
Anonymous, "Cleaning Tool and Method for Cleaning a Portion of a Lithography Apparatus", Research Disclosure, vol. 675, No. 65 (Jun. 17, 2020).
Office Action issued in Japanese Patent Application No. 2022-521359, dated Jun. 5, 2023.

* cited by examiner

SYSTEMS FOR CLEANING A PORTION OF A LITHOGRAPHY APPARATUS

CROSS-REFERENCE TO RELATED APPLICATIONS

This application is the U.S. national phase entry of PCT Patent Application No. PCT/EP2020/079526 which was filed on Oct. 20, 2020, which claims the benefit of priority of U.S. Provisional Patent Application No. 62/931,864, which was filed on Nov. 7, 2019 and which is incorporated herein in its entirety by reference.

TECHNICAL FIELD

The description herein relates generally to systems and methods for cleaning a portion of a lithography apparatus.

BACKGROUND

A lithography (e.g., projection) apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemical mechanical polishing, etc., all intended to finish an individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical mechanical polishing, ion implantation, and/or other processes. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc. One or more metrology processes are typically involved in the patterning process.

Lithography is a step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a system for cleaning a portion of a lithography apparatus. The system comprises a cleaning tool, and/or other components. The cleaning tool is configured to be inserted into the lithography apparatus in a first configuration, engaged by a tool handler of the lithography apparatus, and used for cleaning the portion of the lithography apparatus. The cleaning tool is configured to move from the first configuration to a second, expanded configuration, after engagement by the tool handler such that the cleaning tool is in the second configuration when used for cleaning the portion of the lithography apparatus.

In an embodiment, the system further comprises a container configured to hold the cleaning tool in the first configuration and fit into the lithography apparatus. The cleaning tool is configured to be inserted into the lithography apparatus in the container, moved from the container by the tool handler for the cleaning, and returned to the container by the tool handler after the cleaning.

In an embodiment, the cleaning tool is configured to move from the first configuration to the second configuration when the cleaning tool is moved from the container by the tool handler for cleaning.

In an embodiment, the cleaning tool is configured to move from the second configuration to the first configuration when the cleaning tool is returned to the container by the tool handler after cleaning.

In an embodiment, the container comprises one or more contraction components configured to facilitate contraction of the cleaning tool from the second configuration to the first configuration when the cleaning tool is returned to the container after the cleaning. In an embodiment, the one or more contraction components comprise a ridge in the container configured to push on the cleaning tool when the cleaning tool is returned to the container after the cleaning.

In an embodiment, the portion of the lithography apparatus comprises reticle stage reticle clamps.

In an embodiment, the cleaning tool comprises a cleaning reticle.

In an embodiment, the tool handler comprises a reticle handler turret gripper.

In an embodiment, the lithography apparatus is configured for deep ultra violet (DUV) radiation.

In an embodiment, the first configuration comprises a contracted configuration relative to the second configuration.

In an embodiment, the cleaning tool comprises one or more links coupled by hinged joints configured to facilitate expansion or contraction between the first configuration and the second configuration. In an embodiment, the cleaning tool comprises one or more flexible portions configured to facilitate expansion or contraction between the first configuration and the second configuration. In an embodiment, the cleaning tool comprises one or more rotating portions configured to facilitate expansion or contraction between the first configuration and the second configuration.

In an embodiment, the cleaning tool comprises one or more tool handler engagement surfaces configured to remain in a position and orientation that corresponds to the tool handler whether the cleaning tool is in the first configuration or the second configuration.

In an embodiment, the cleaning tool comprises one or more cleaning surfaces configured to move relative to the one or more tool handler engagement surfaces when the cleaning tool moves between the first and second configurations. In an embodiment, the one or more cleaning surfaces are configured to contact one or more target surfaces of the portion of the lithography apparatus for cleaning when the cleaning tool is in the second configuration. In an embodiment, the one or more cleaning surfaces are configured to be parallel to the one or more target surfaces when the cleaning tool is in the second configuration. In an embodiment, the one or more target surfaces comprise one or more membrane surfaces of the lithography apparatus.

In an embodiment, the cleaning tool comprises a cleaning surface at least partially covered by cleaning material; an identification surface, the identification surface being on an opposite side of the cleaning tool relative to the cleaning surface; and one or more identification features located between the cleaning surface and the identification surface, the one or more identification features being visible through the identification surface.

In an embodiment, the cleaning surface is opaque, and the identification surface is transparent.

In an embodiment, the cleaning tool comprises one or more interior surfaces between the cleaning surface and the identification surface. The one or more identification features are located on the one or more interior surfaces.

In an embodiment, the one or more identification features comprise one or both of a bar code and an alignment mark.

In an embodiment, the cleaning tool comprises an illumination source located between the cleaning surface and the identification surface in an interior of the cleaning tool. The illumination source is configured to provide illumination such that the one or more identification features are visible through the identification surface.

In an embodiment, the illumination source comprises a light emitting diode (LED). In an embodiment, the illumination source comprises an illumination guide configured to guide illumination from the LED toward the one or more identification features and through the identification surface.

In an embodiment, the illumination source comprises one or more mirrors configured to guide ambient light from below the cleaning tool through an interior of the cleaning tool toward the one or more identification features and through the identification surface.

According to another embodiment, there is provided a method for cleaning a portion of a lithography apparatus with a cleaning tool. The method comprises inserting the cleaning tool into the lithography apparatus in a first configuration, engaging the cleaning tool with a tool handler of the lithography apparatus; moving the cleaning tool from the first configuration to a second, expanded configuration; and using the cleaning tool for cleaning the portion of the lithography apparatus. The cleaning tool is in the second configuration when used for cleaning the portion of the lithography apparatus.

In an embodiment, the method comprises holding the cleaning tool in the first configuration in a container, and inserting the cleaning tool into the lithography apparatus in the container, moving the cleaning tool from the container with the tool handler for the cleaning, and returning the cleaning tool to the container with the tool handler after the cleaning.

In an embodiment, the cleaning tool is configured to move from the first configuration to the second configuration when the cleaning tool is moved from the container by the tool handler for cleaning.

In an embodiment, the cleaning tool is configured to move from the second configuration to the first configuration when the cleaning tool is returned to the container by the tool handler after cleaning.

In an embodiment, the container comprises one or more contraction components. The method comprises facilitating contraction of the cleaning tool from the second configuration to the first configuration when the cleaning tool is returned to the container after the cleaning with the contraction components.

In an embodiment, the portion of the lithography apparatus comprises reticle stage reticle clamps.

In an embodiment, the cleaning tool comprises a cleaning reticle.

In an embodiment, the tool handler comprises a reticle handler turret gripper.

In an embodiment, the lithography apparatus is configured for deep ultra violet (DUV) radiation.

In an embodiment, the moving is facilitated by one or more links coupled by hinged joints in the cleaning tool configured to facilitate expansion or contraction between the first configuration and the second configuration. In an embodiment, the moving is facilitated by one or more flexible portions of the cleaning tool configured to facilitate expansion or contraction between the first configuration and the second configuration. In an embodiment, the moving is facilitated by one or more rotating portions of the cleaning tool configured to facilitate expansion or contraction between the first configuration and the second configuration.

In an embodiment, the method comprises providing a cleaning surface on the cleaning tool that is at least partially covered by cleaning material; providing an identification surface on the cleaning tool, the identification surface being on an opposite side of the cleaning tool relative to the cleaning surface; providing one or more identification features on the cleaning tool, the one or more identification features located between the cleaning surface and the identification surface on one or more interior surfaces of the cleaning tool, the one or more identification features visible through the identification surface; and providing an illumination source located between the cleaning surface and the identification surface in an interior of the cleaning tool, the illumination source configured to provide illumination such that the one or more identification features are visible through the identification surface.

According to another embodiment, there is provided a computer program product comprising a non-transitory computer readable medium having instructions recorded thereon, the instructions when executed by a computer implementing any of the methods described above.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figure 1:
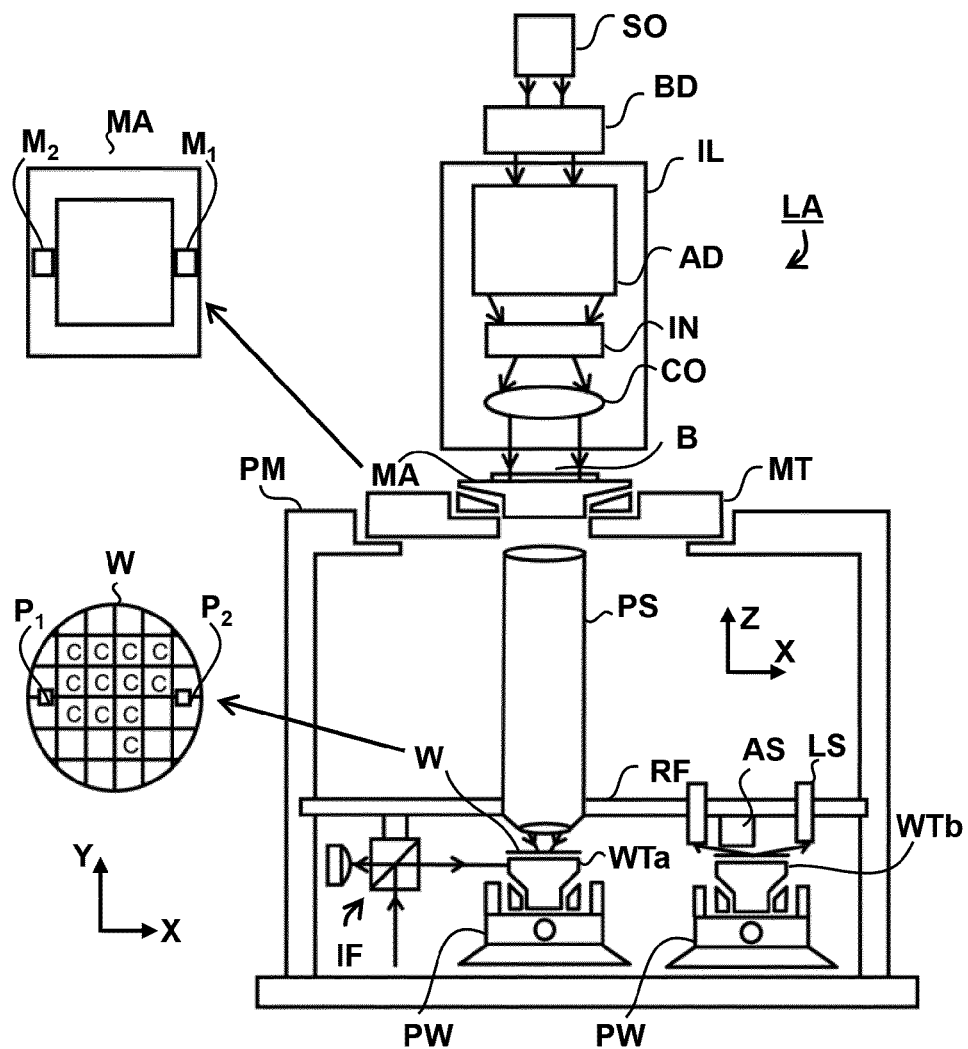
FIG. 1 schematically depicts a lithography apparatus, according to an embodiment.

In general, a mask or reticle may be a transparent block of material that is covered with a pattern defined by a different, opaque material. Various masks are fed into a lithographic apparatus and used to form layers of a semiconductor device. The pattern defined on a given mask or reticle corresponds to features produced in one or more layers of the semiconductor device. Often, a plurality of masks or reticles are automatically fed into a lithographic apparatus during manufacturing and used to form corresponding layers of a semiconductor device. Clamps (e.g., reticle stage reticle clamps) in the lithographic apparatus are used to secure the masks or reticles during processing. These clamps need periodic cleaning. Typically, cleaning requires stopping the lithographic apparatus and the manufacturing process. The cleaning is performed manually by a technician and requires several hours to complete.

Advantageously, the present systems and methods provide a cleaning tool configured to be used to clean the clamps and/or associated membranes of a lithographic apparatus in-situ, while the lithographic apparatus continues to operate. The clamps comprise several components that are configured to support and provide a connection to a chuck body. The membranes are the portions of the clamps that are in contact with a reticle. The cleaning tool is configured to be automatically inserted into, and handled by, the lithographic apparatus just as any other mask or reticle is automatically inserted into, and handled by, the lithographic apparatus. Cleaning the lithographic apparatus with the present cleaning tool saves hours of downtime associated with prior cleaning methods. In addition, in some embodiments, the present system is configured to avoid contaminating other parts of the lithographic apparatus (e.g., a reticle handler robot gripper) with material removed from the cleaned (reticle stage reticle) clamps and/or their associated membranes, as described below.

In some embodiments, the cleaning tool comprises a cleaning reticle configured with an internal illumination source. The illumination source is configured to illuminate internal cleaning reticle identification features. The identification features are used by a camera of the lithographic apparatus to identify and track the position of the cleaning reticle. Advantageously, the illumination source and the internal identification features allow cleaning material to fully cover a cleaning surface of the cleaning reticle, without obscuring the identification features from the camera. In addition, an outer surface of the cleaning reticle opposite the cleaning surface may remain smooth for gripping by the lithographic apparatus.

Although specific reference may be made in this text to the manufacture of integrated circuits (ICs), it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively. In addition, any use of the terms "reticle" or "mask" herein may be considered synonymous with the more general term "patterning device."

As an introduction, FIG. 1 schematically depicts an embodiment of a lithographic apparatus LA that may be included in and/or associated with the present systems and/or methods. The apparatus comprises: an illumination system (illuminator) IL configured to condition a radiation beam B (e.g. UV radiation, DUV radiation, or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame (RF).

As depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AD configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AD. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode, the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation. Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" used herein should be broadly interpreted as referring to any device that can be used to impart a pattern in a target portion of the substrate. In an embodiment, a patterning device is any device that can be used to impart a radiation beam with a pattern in its cross-section to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WTa or WTb) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism configured to adjust one or more of the optical elements to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes: 1. In step mode, the support structure MT and the substrate table WT are kept essentially stationary, while a pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure. 2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. 3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes multiple processed layers.

The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that other patterns are not defective.

Figure 2:
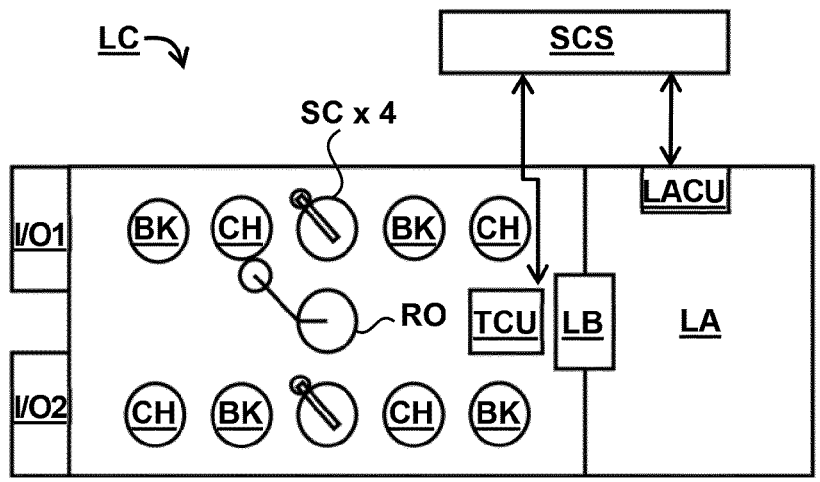
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. For example, contamination on reticle clamps (e.g., as described herein) may adversely affect overlay because clamping a reticle over such contamination will distort the reticle. Accordingly, a manufacturing facility in which lithocell LC is located also typically includes a metrology system that measures some or all of the substrates W (FIG. 1) that have been processed in the lithocell or other objects in the lithocell. The metrology system may be part of the lithocell LC, for example it may be part of the lithographic apparatus LA (such as alignment sensor AS (FIG. 1)).

The one or more measured parameters may include, for example, alignment, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching, after-etching, after deposition, and/or at other times.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target.

Thus, in a device fabrication process (e.g., a patterning process, a lithography process, etc.), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as the ASML YieldStar metrology tool, the ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which meet specifications.

Within a metrology system MET, a metrology apparatus is used to determine one or more properties of the substrate, and in particular, how one or more properties of different substrates vary, or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

As lithography nodes keep shrinking, more and more complicated wafer designs may be implemented. Various tools and/or techniques may be used by designers to ensure complex designs are accurately transferred to physical wafers. These tools and techniques may include mask optimization, source mask optimization (SMO), OPC, design for control, and/or other tools and/or techniques. For example, a source mask optimization process is described in U.S. Pat. No. 9,588,438 titled "Optimization Flows of Source, Mask and Projection Optics", which is incorporated in its entirety by reference.

The present systems, and/or methods may be used as stand-alone tools and/or techniques, and/or or used in conjunction with other semiconductor manufacturing processes, to enhance the accurate transfer of complex designs to physical wafers.

As described above, the present system includes a cleaning tool configured to be used to clean a portion of a lithographic apparatus in-situ, while the lithographic apparatus continues to operate. For example, the cleaning tool may simply replace a typical reticle inserted into the lithographic apparatus. The lithographic apparatus may move the cleaning tool through typical movements and/or positions of the replaced reticle such that the lithographic apparatus does not require special adjustments for the cleaning tool during operation. In some embodiments, the portion of the lithography apparatus to be cleaned comprises reticle stage reticle clamps, associated membranes, and/or other portions of the lithographic apparatus. The cleaning tool is configured to be automatically inserted into, and handled (e.g., moved, rotated, etc.) by, the lithographic apparatus just as any other mask or reticle is automatically inserted into, and handled by, the lithographic apparatus. Cleaning the lithographic apparatus with the present cleaning tool saves hours of downtime associated with prior cleaning methods. In addition, the present system is configured to avoid contaminating other parts of the lithographic apparatus (e.g., a reticle handler robot gripper) with material removed from the cleaned (reticle stage reticle) clamps, as described below. The cleaning tool is configured to be inserted into the lithography apparatus in a container in a first, contracted configuration, engaged by a tool handler of the lithography apparatus, and used for cleaning the portion of the lithography apparatus. The cleaning tool is configured to move from the contracted configuration, out of the container to a second, expanded configuration, after engagement by the tool handler such that the cleaning tool is in the second configuration when used for cleaning the portion of the lithography apparatus.

Figure 3A:
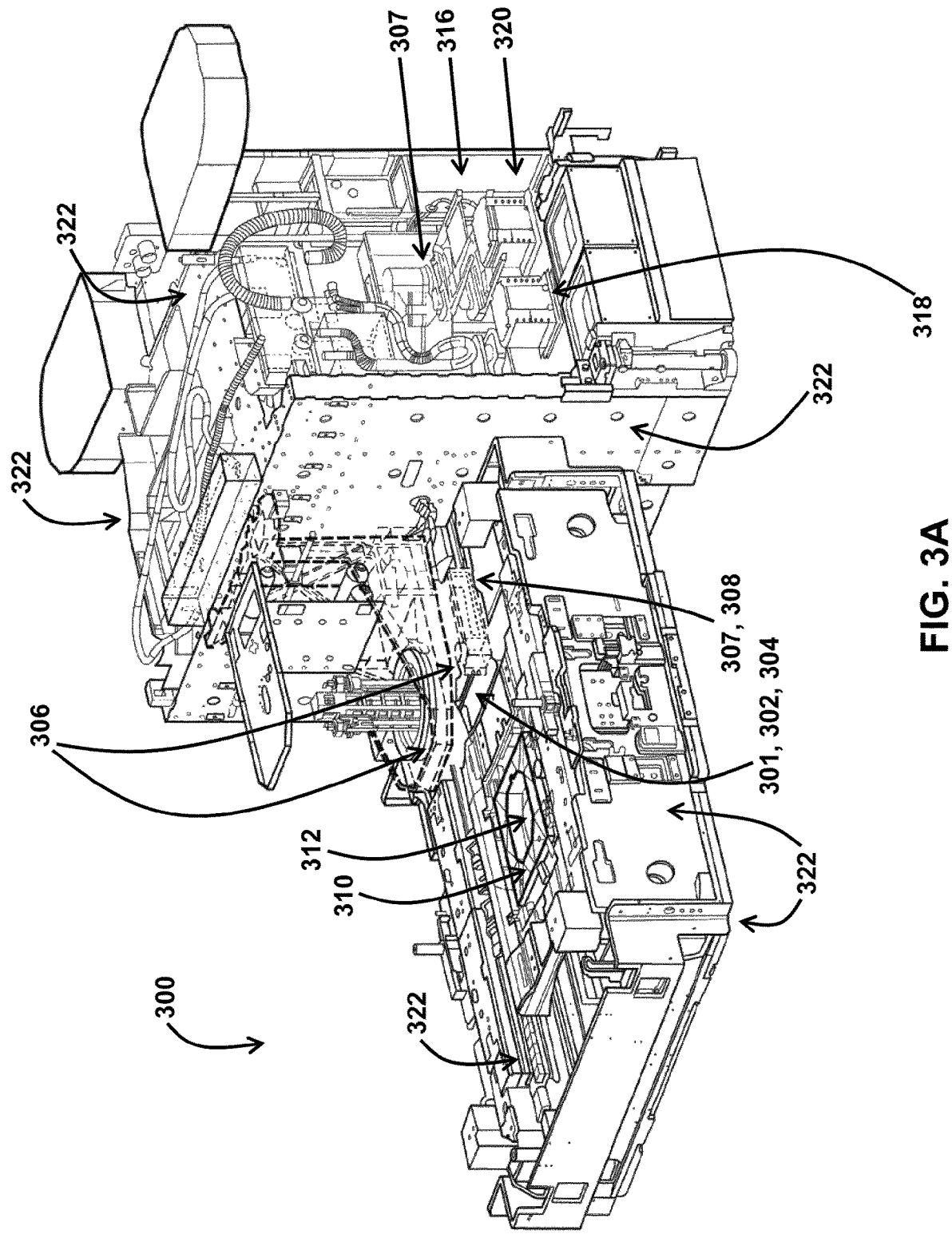
FIG. 3A illustrates a lithographic apparatus including a cleaning tool, a cleaning tool container, a reticle handler turret gripper, reticle stage reticle clamps, and/or other components, according to an embodiment.
Figure 3B:
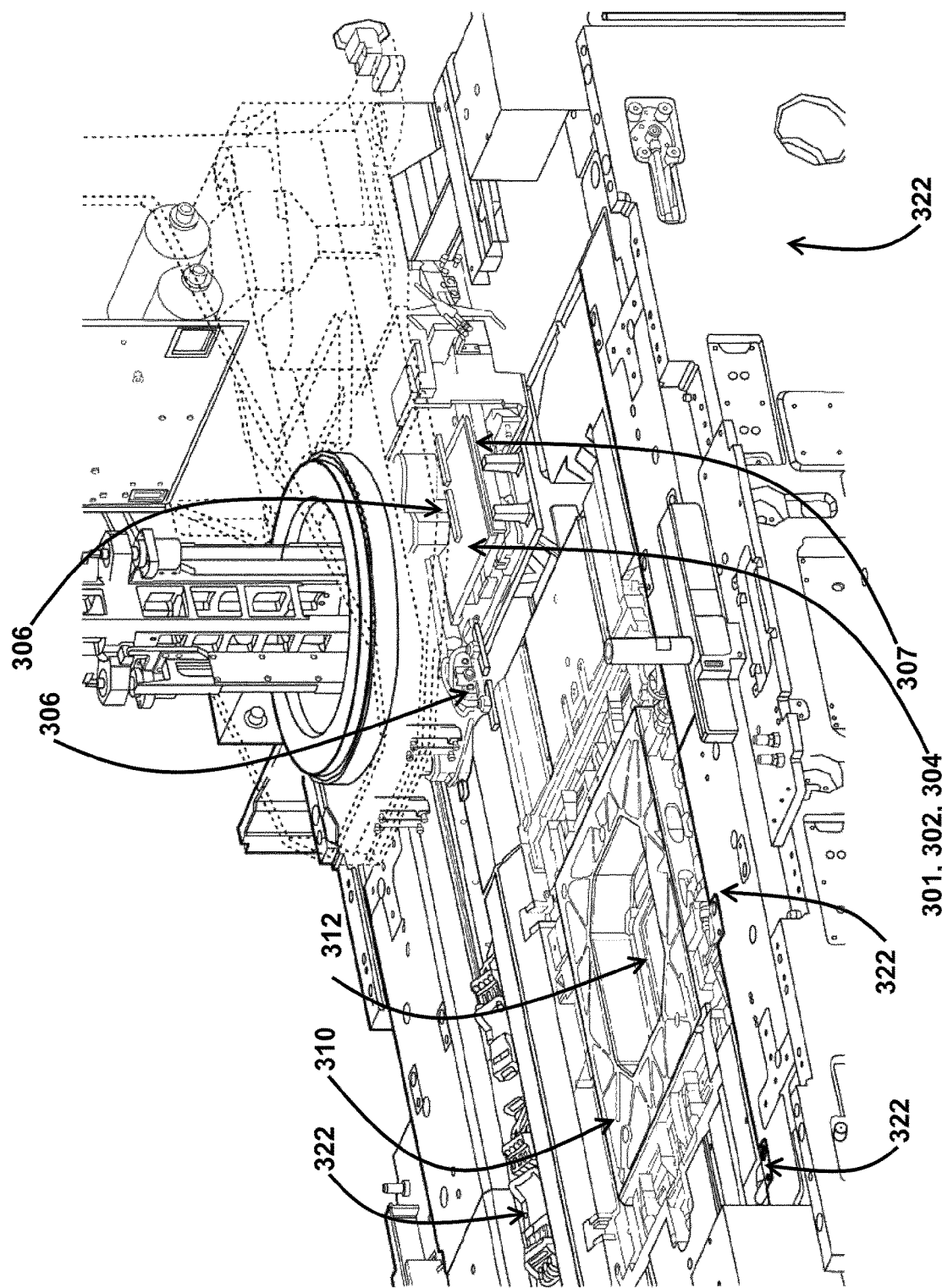
FIG. 3B is an enlarged view of a portion of the lithographic apparatus shown in FIG. 3A, according to an embodiment.

In some embodiments, the present system includes the cleaning tool, a container configured to hold the cleaning tool, and/or other components. By way of a non-limiting example, FIGS. 3A and 3B illustrate (a portion of) a lithographic apparatus 300 (e.g., similar to an or the same as the lithographic apparatus shown in FIG. 1). FIG. 3A illustrates present system 301 comprising a cleaning tool 302, and a cleaning tool container 304, and/or other components; and various components of lithographic apparatus 300 including a tool handler 306, 307, 308, reticle stage 310 reticle clamps 312 (only one side is visible in FIG. 3A), and/or other components. In some embodiments, lithographic apparatus 300 is configured for deep ultraviolet (DUV) lithography. In some embodiments, cleaning tool 302 comprises a cleaning reticle and/or other components. In some embodiments, tool handler 306, 307, 308 comprises a reticle handler turret gripper 306, a reticle handler robot gripper 307 (having associated clamps, etc. 308 for gripping a reticle), and/or other components. Reticle handler robot gripper 307 may, for example, move a reticle from a pod 320 (e.g., after a user places a reticle in pod 320). Reticle handler turret gripper 306 may, for example, move a reticle from reticle handler robot gripper 307 to reticle clamps 312. Lithographic apparatus 300 may include various other mechanical components 322 (translation mechanisms, elevation mechanisms, rotational mechanisms, motors, power generation and transmission components, structural components, etc.) configured to facilitate movement and control of cleaning tool 302 and/or cleaning tool container 304 through lithographic apparatus 300.

Cleaning tool 302 is configured to be used to clean clamps 312 and/or associated membranes (e.g., membranes of the clamps that make contact with the underside of the reticle) of lithographic apparatus 300 in-situ, while lithographic apparatus 300 continues to operate. Container 304 is configured to hold cleaning tool 302. Cleaning tool 302 and container 304 are configured to be automatically inserted into, and handled by, lithographic apparatus 300 just as any other mask or reticle 316 is automatically inserted into, and handled by, lithographic apparatus 300. For example, cleaning tool 302 and/or cleaning tool container 304 are sized and shaped to be inserted into lithographic apparatus 300 at a typical insertion point 318 using a typical insertion method, just as any other reticle 316 would be inserted into apparatus 300.

FIG. 3B is an enlarged view of a portion of apparatus 300. FIG. 3B shows cleaning tool 302, cleaning tool container 304, reticle handler turret gripper 306, reticle stage 310, reticle stage reticle clamps 312 (only one side is visible in FIG. 3B), mechanical components 322, reticle handler robot gripper 307, and/or other components. As shown in FIG. 3B, reticle handler turret gripper 306 is configured to move cleaning tool 302 and/or container 304 from reticle handler robot gripper 307 to reticle stage 310 reticle clamps 312 so cleaning tool 302 can be used to clean clamps 312 in situ. Moving cleaning tool 302 may comprise moving cleaning tool toward or away from clamps 312 in horizontal, vertical, and/or other directions. Reticle handler turret gripper 306 and/or reticle handler robot gripper 307 may include various motors, translators, rotational components, clamps, clips, power sources, power transmission components, vacuum mechanisms, and/or other components that facilitate the movement of cleaning tool 302 and/or container 304.

Because of the volume constraints within reticle handler robot gripper 307, and the size of cleaning surfaces required to clean reticle stage 310 reticle clamps 312, cleaning tool 302 is configured to have an expanded configuration for cleaning that is larger than the internal volume and/or outer perimeter of container 304. For example, a typical reticle fits between clamps 312 and also fits within a clamping portion of reticle handler robot gripper 307 and turret gripper 306. However, cleaning tool 302, which needs to fit within the clamping portion of grippers 306 and 307 for handling by lithographic apparatus 300, also needs to cover at least a portion of clamps 312 (not fit between them) for cleaning.

Cleaning tool 302 is configured to have a (first) contracted configuration, so that it can be stored in container 304 (and be moved through apparatus 300 like any other reticle). Cleaning tool 302 is configured to be removed from container 304 by reticle handler turret gripper 306 for cleaning. Once removed from container 304 by reticle handler turret gripper 306, cleaning tool 302 is configured to move to a (second) expanded configuration, having a size that is appropriate for the cleaning procedure. In other words, cleaning tool 302 is configured to move from the first configuration to the second configuration when cleaning tool 302 is moved from container 304 by gripper 306—a portion of the tool handler—for cleaning. Cleaning tool 302 is configured to return to the contracted configuration in container 304 for storage in, and/or removal from, lithographic apparatus 300 by reticle handler robot gripper 307. Container 304 remains in reticle handler robot gripper 307 during cleaning. Cleaning tool 302 is configured to be returned to container 304 after cleaning by reticle handler turret gripper 306. Put a different way, cleaning tool 302 is configured to move from the second configuration to the first configuration when cleaning tool 302 is returned to container 304 by gripper 306 (another portion of the tool handler) after cleaning.

Figure 4:
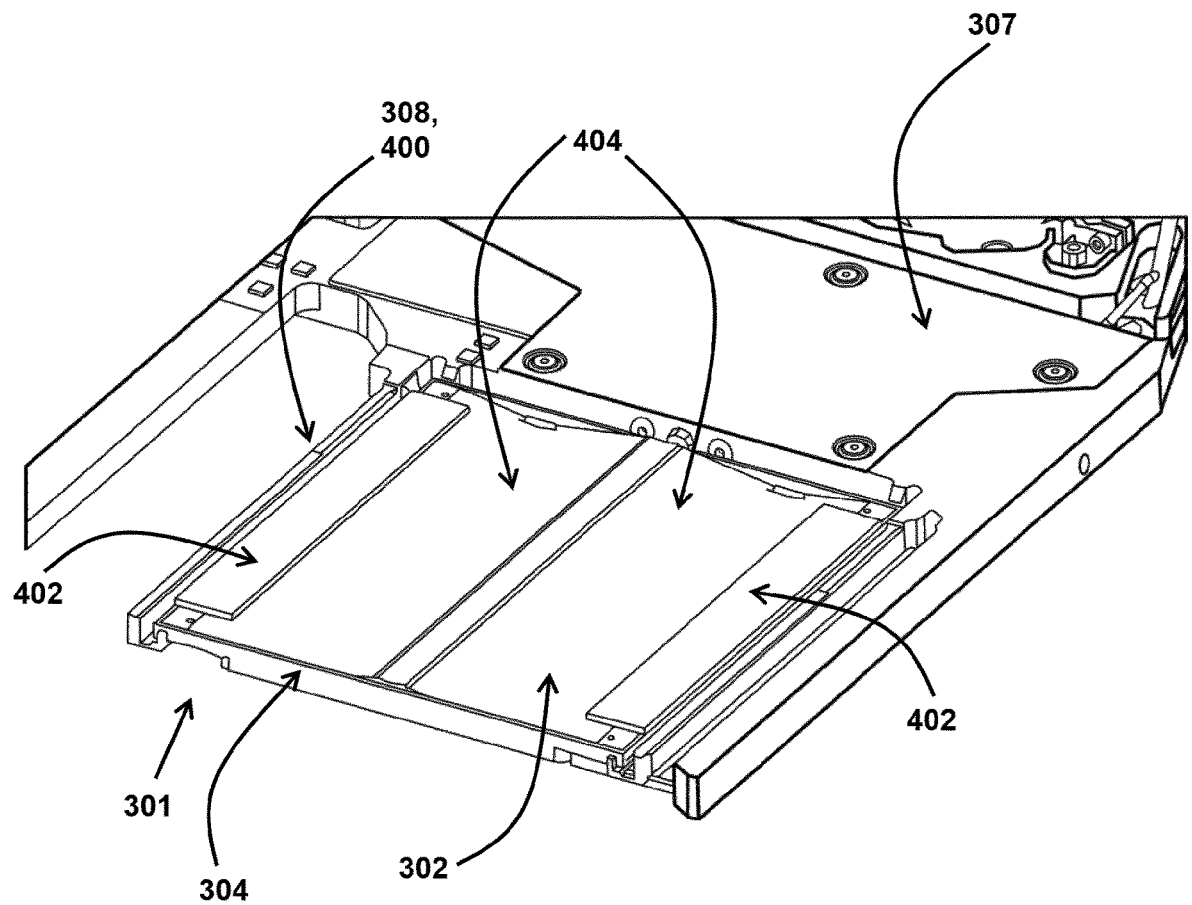
FIG. 4 illustrates a clamping portion of a reticle handler robot gripper of the lithographic apparatus of FIG. 3A, a cleaning tool container, a cleaning tool (e.g., reticle), and/or other components, according to an embodiment.

FIG. 4 illustrates a clamping portion 400 of reticle handler robot gripper 307, cleaning tool container 304, cleaning tool (e.g., reticle) 302, and/or other components. As described above, reticle handler robot gripper 307 is configured to move container 304 with cleaning tool 302 (or another reticle) from a pod 320 (FIG. 3A) after a user places container 304 with cleaning tool 302 in pod 320, to reticle handler turret gripper 306 (FIG. 3A, 3B). Clamping portion 400 includes clamps 308 that grip container 304. Container 304 is configured to hold cleaning tool 302 when cleaning tool 302 is in the (first) contracted configuration, and fit into (a pod of) lithography apparatus 300 (FIG. 3A, 3B). Cleaning tool 302 is shown in the contracted configuration within container 304 in FIG. 4. With cleaning tool 302 in the contracted configuration in container 304, cleaning tool 302 may be moved through lithographic apparatus 300 (FIG. 3A, 3B) like any other reticle. Cleaning tool 302 is configured to be inserted into lithography apparatus 300 in container 304, moved from container 304 by tool handler (turret gripper) 306 for the cleaning, and returned to container 304 by tool handler (turret gripper) 306 after the cleaning.

Figure 5:
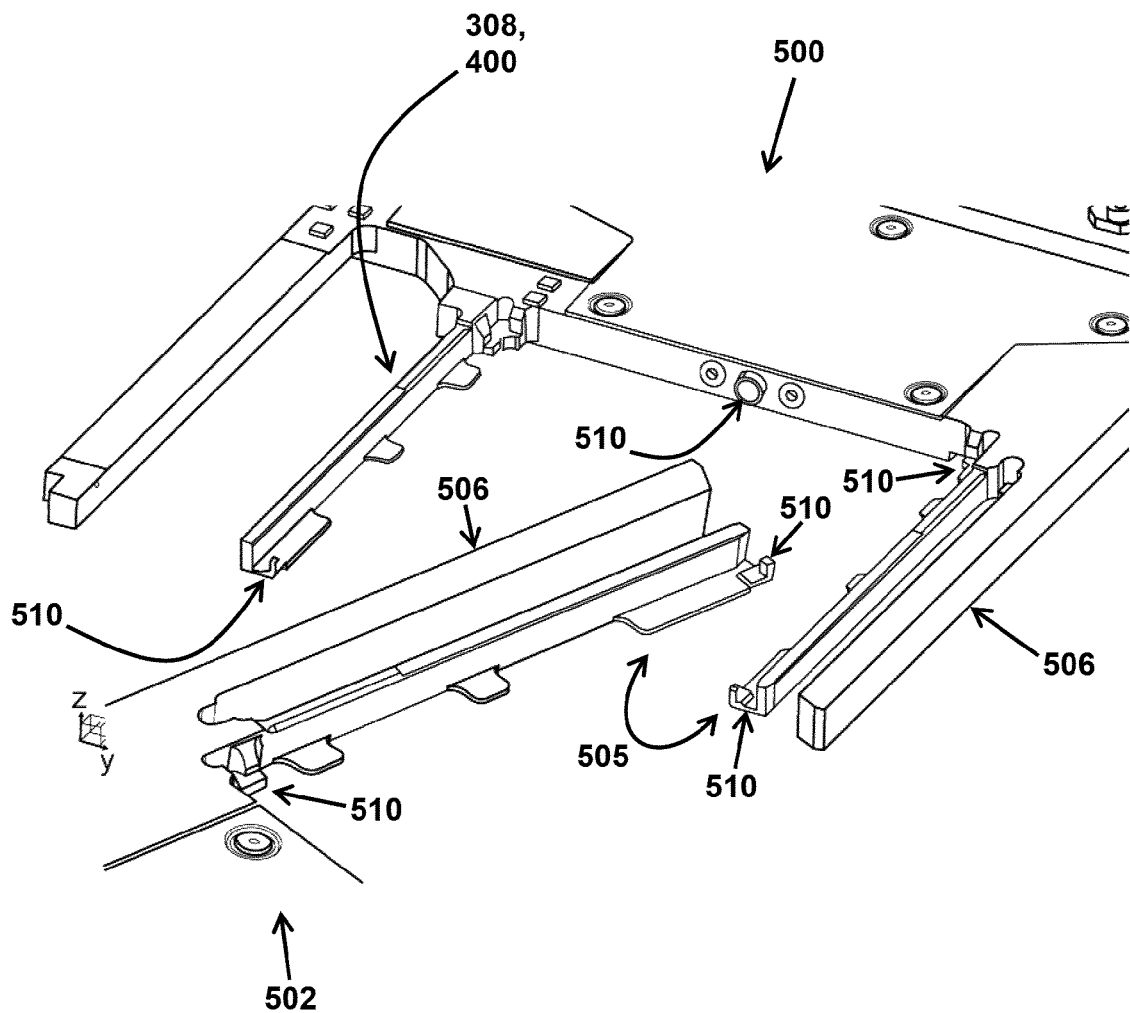
FIG. 5 illustrates the clamping portion of the reticle handler robot gripper, without the cleaning tool container or the cleaning tool, according to an embodiment.

FIG. 5 illustrates two views 500, 502 of clamping portion 400 of the reticle handler robot gripper (e.g., 307 shown in FIGS. 3A and 3B), without the cleaning tool container (e.g., 304 shown in FIG. 4) or the cleaning tool (e.g., 302 shown in FIG. 4). View 502 is a rotated 505 view of one arm 506 of clamping portion 400 (to provide enhanced viewing of the inside edge of arm 506). Views 500 and 502 illustrate banking surfaces 510 of clamping portion 400. Banking surfaces 510 may be surfaces of clamping portion 400 configured to contact container 304 and/or other reticles. Cleaning tool container 304 is configured to protect banking surfaces 510 of clamping portion 400 of reticle handler robot gripper 307 from contact with cleaning surfaces of cleaning tool (e.g., reticle) 302. System 301 (FIGS. 3A, 3B, and 4) is configured such that banking surfaces 510 of clamping portion 400 of reticle handler robot gripper 307 contact outer surfaces of container 304. When cleaning tool 302 is returned to container 304 after cleaning, any contamination picked up by cleaning tool 302 is kept within container 304, and not spread to other portions of apparatus 300 (FIGS. 3A and 3B), including banking surfaces 510. This reduces and/or substantially eliminates the possibility of contaminating other (e.g., customer) reticles in apparatus 300 and/or re-contaminating reticle stage 310 (FIG. 3A), clamps 312 (FIG. 3B), and/or other components.

Returning to FIG. 4, in some embodiments, cleaning tool 302 comprises one or more tool handler engagement surfaces 402 and/or other components. Engagement surfaces 402 are configured to remain in a position and orientation that corresponds to the tool handler (e.g., gripper 306) whether cleaning tool 302 is in the contracted (e.g., first) configuration or the expanded (e.g., second) configuration. In some embodiments, cleaning tool 302 comprises one or more cleaning portions 404 having cleaning surfaces (under or bottom side of portions 404—not visible in FIG. 4). Cleaning portions 404 and/or the cleaning surfaces are configured to move relative to tool handler engagement surfaces 402 when cleaning tool 302 moves between the contracted (e.g., first) and expanded (e.g., second) configurations. In some embodiments, the movement may be relative rotation, and/or other movement. In some embodiments, the cleaning surfaces are configured to contact one or more target surfaces of the portion of the lithography apparatus for cleaning (e.g., clamps 312 shown in FIGS. 3A and 3B and/or associated membranes) when cleaning tool 302 is in the expanded configuration. In some embodiments, the cleaning surfaces are configured to be parallel to the one or more target surfaces when cleaning tool 302 is in the expanded configuration. In some embodiments, the one or more target surfaces comprise one or more clamps 312, associated membrane surfaces of the lithography apparatus, and/or other target surfaces.

Figure 6:
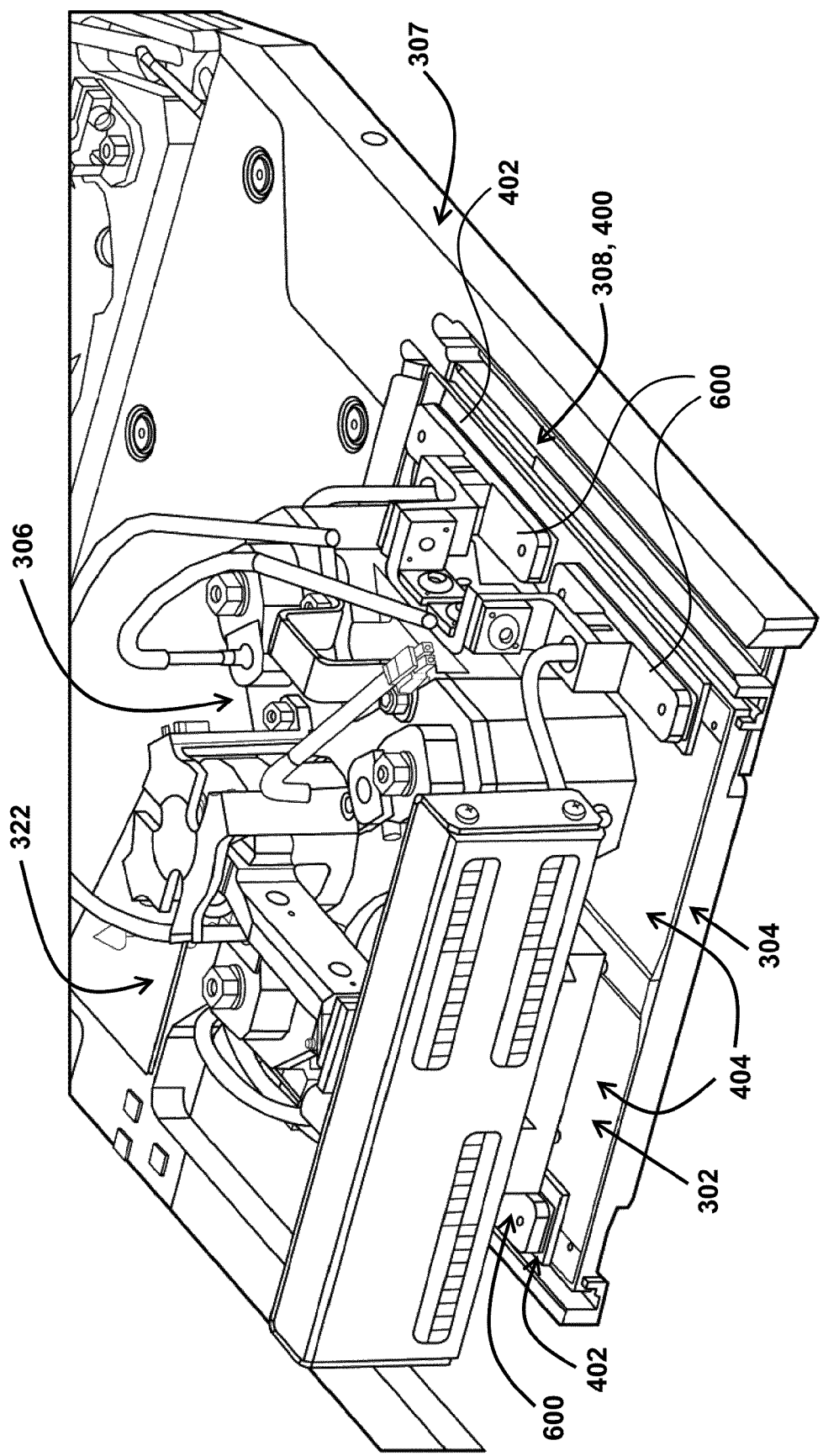
FIG. 6 illustrates a reticle handler turret gripper gripping the cleaning tool in a contracted configuration in the cleaning tool container, according to an embodiment.
Figure 7:
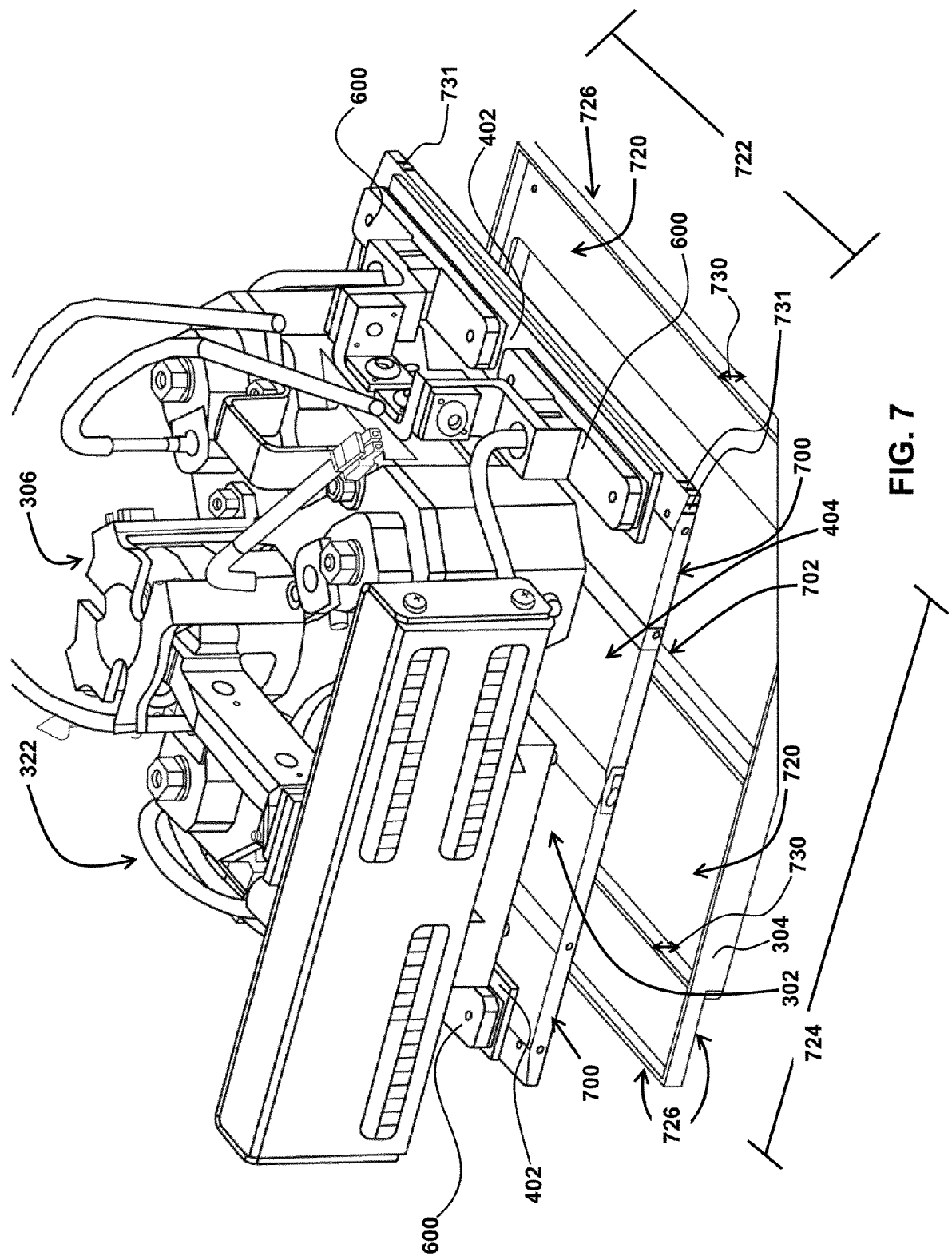
FIG. 7 illustrates the reticle handler turret gripper moving the cleaning tool out of the cleaning tool container, according to an embodiment.

FIG. 6 and FIG. 7 provide further illustration. FIG. 6 illustrates reticle handler turret gripper 306 gripping cleaning tool 302 (in the contracted configuration) in container 304. FIG. 7 illustrates reticle handler turret gripper 306 moving cleaning tool 302 out of container 304. Cleaning tool 302 has expanded to the expanded configuration responsive to being moved out of container 304. Engagement surfaces 402 are configured to remain in a position and orientation that corresponds to gripping feet 600 of gripper 306 whether cleaning tool 302 is in the contracted (e.g., as shown in FIG. 6) configuration or the expanded (e.g., as shown in FIG. 7) configuration. In this example, surfaces 402 remain at a fixed distance from each other that corresponds to a distance between feet 600. Surfaces 402 also remain perpendicular to feet 600 to facilitate gripping by feet 600. Cleaning portions 404 having cleaning surfaces 700 (under or bottom side of portions 404—shown in FIG. 7). Cleaning portions 404 and/or cleaning surfaces 700 are configured to move (see transition from FIG. 6 to FIG. 7) relative to tool handler engagement surfaces 402 when cleaning tool 302 moves between the contracted (e.g., FIG. 6) and expanded (e.g., FIG. 7) configurations. In some embodiments, cleaning surfaces 700 may be fixed to the greater reticle structure (e.g., via coating, bonding, and/or other operations). In some embodiments, cleaning surfaces 700 may be separate pieces that are removable and/or replaceable. In some embodiments, cleaning surfaces 700 are configured to be parallel to the one or more target surfaces of lithographic apparatus 300 (FIGS. 3A and 3B) when cleaning tool 302 is in the expanded configuration (FIG. 7).

In some embodiments, as shown in FIG. 7, cleaning tool 302 may include an elastomer 731 and/or other materials at or near corners of cleaning tool 302. Elastomer 731 may be a resilient/damping material coupled to cleaning tool 302. Elastomer 731 may limit movement of cleaning tool 302 during cleaning, cushion an impact of cleaning tool 302 with reticle buffers, portions of reticle handler turret gripper 306, portions of container 304, and/or have other purposes.

Figure 8:
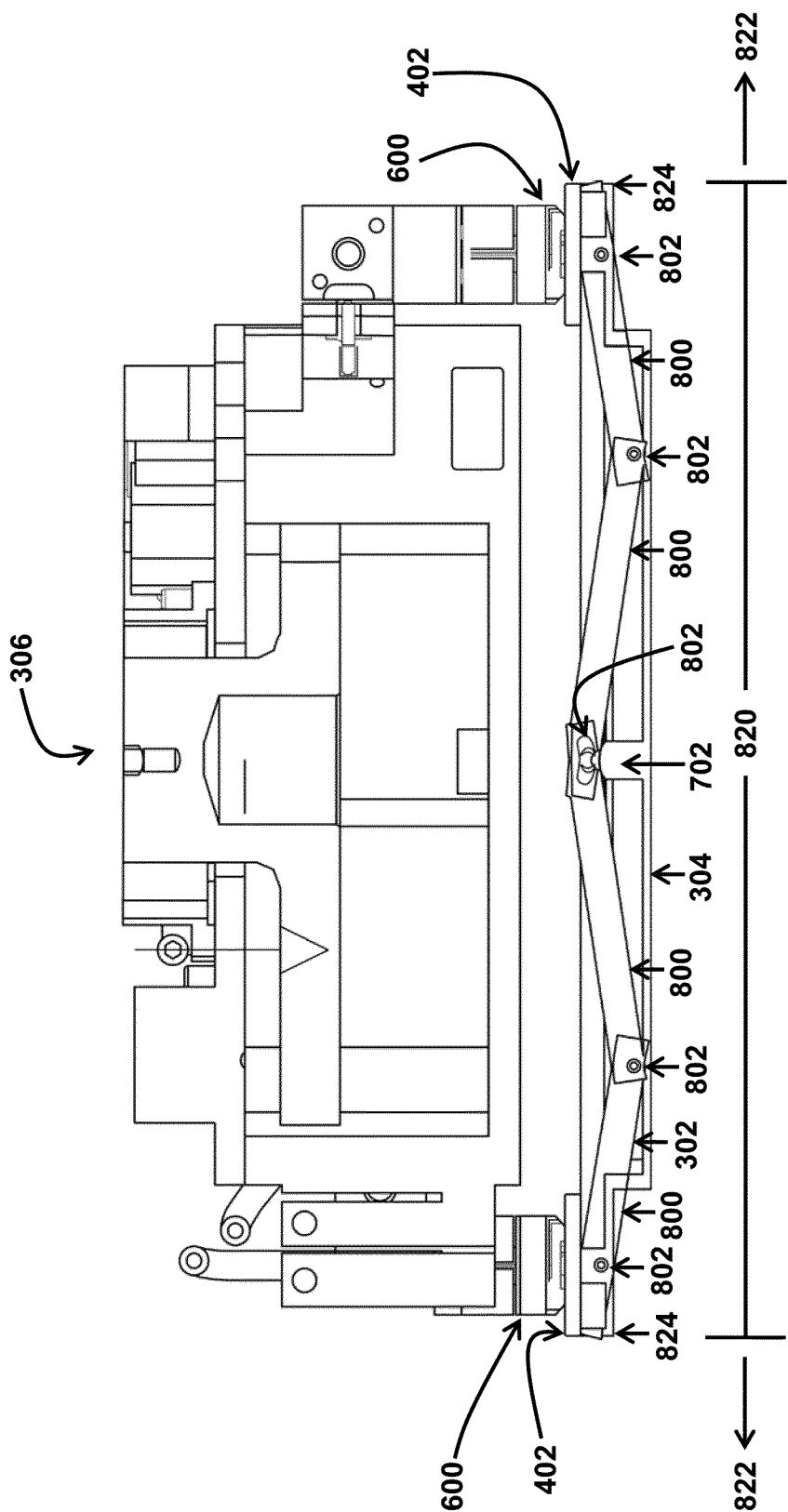
FIG. 8 illustrates a side view of feet of the reticle handler turret gripper gripping the cleaning tool in the contracted configuration in the container, according to an embodiment.
Figure 9:
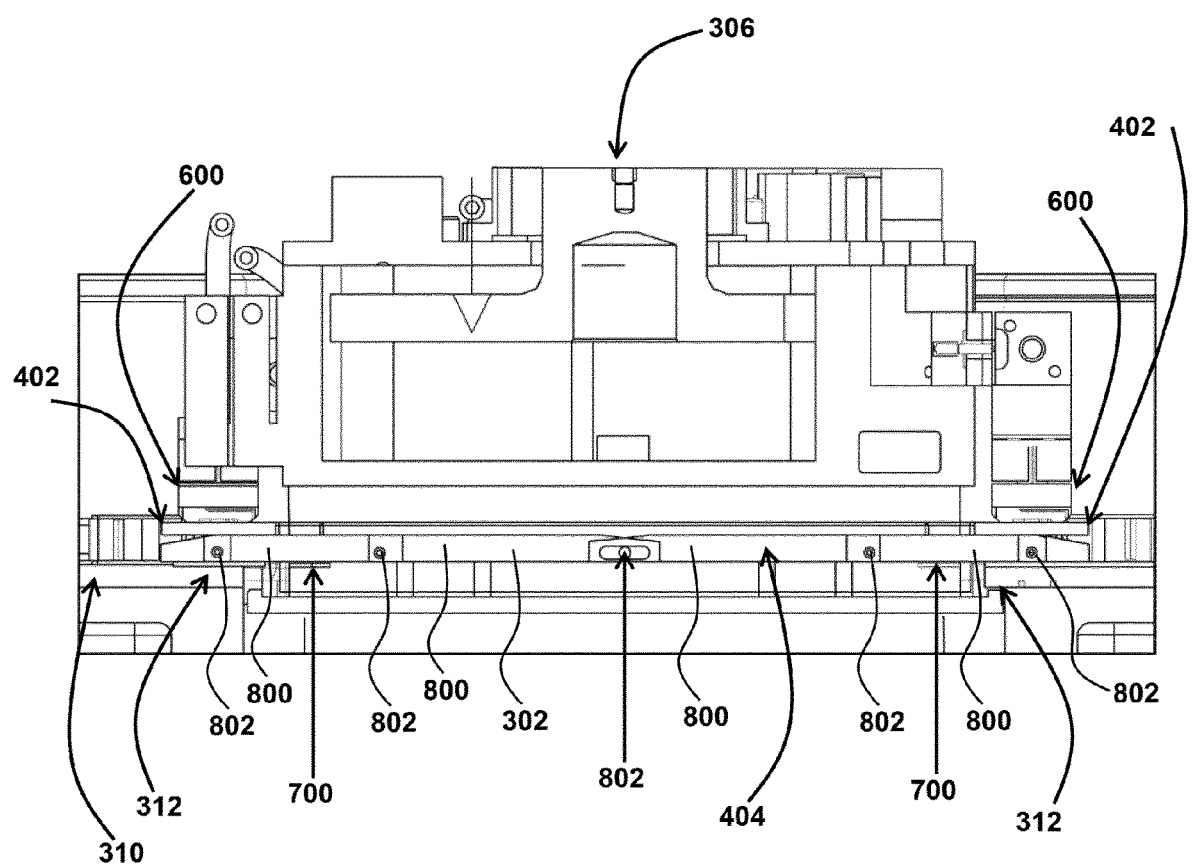
FIG. 9 illustrates the reticle handler turret gripper moving cleaning surfaces of the cleaning tool (in the expanded configuration) into contact with target surfaces comprising one or more clamps, associated membrane surfaces of the lithography apparatus, and/or other target surfaces for cleaning, according to an embodiment.

FIG. 8 illustrates a side view of feet 600 of reticle handler turret gripper 306 gripping cleaning tool 302 (in the contracted configuration) in container 304. When cleaning tool 302 is moved from container 304, cleaning tool 302 expands such that a dimension 820 of cleaning tool 302 expands 822 beyond a perimeter 824 of container 304. FIG. 9 illustrates reticle handler turret gripper 306 moving cleaning surfaces 700 of cleaning tool 302 (in the expanded configuration) into contact with target surfaces comprising one or more clamps 312, associated membrane surfaces of the lithography apparatus, and/or other target surfaces for cleaning. As shown in FIG. 9, cleaning tool 302 may be substantially parallel to clamps 312 when brought into contact for cleaning. When brought into contact with clamps 312 for cleaning, the mass of gripper 306 and/or other forces may help keep cleaning tool 302 in contact with clamps 312.

In some embodiments, as shown in FIG. 8 and FIG. 9, cleaning tool 302 comprises one or more links 800 coupled by hinged joints 802 configured to facilitate expansion or contraction between the first (contracted) configuration and the second (expanded) configuration. In some embodiments, cleaning tool 302 comprises one or more flexible portions configured to facilitate expansion or contraction between the first configuration and the second configuration. In some embodiments, cleaning tool 302 comprises one or more rotating portions configured to facilitate expansion or contraction between the first configuration and the second configuration. Other embodiments are contemplated. These embodiments may enable any type of expansion, contraction, deformation, flexing, shape change, and/or other movement that allows cleaning tool 302 to move from a size that fits into container 304 to a size that is appropriate for cleaning reticle stage 310 reticle clamps 312, and/or associated membranes, as described herein. When cleaning tool 302 is moved from container 304 (FIG. 8), gravity, springs, magnets, and/or other movement causing mechanisms included in or acting on cleaning tool 302 may cause cleaning tool 302 to move from the contracted configuration to the expanded configuration, for example.

Figure 10:
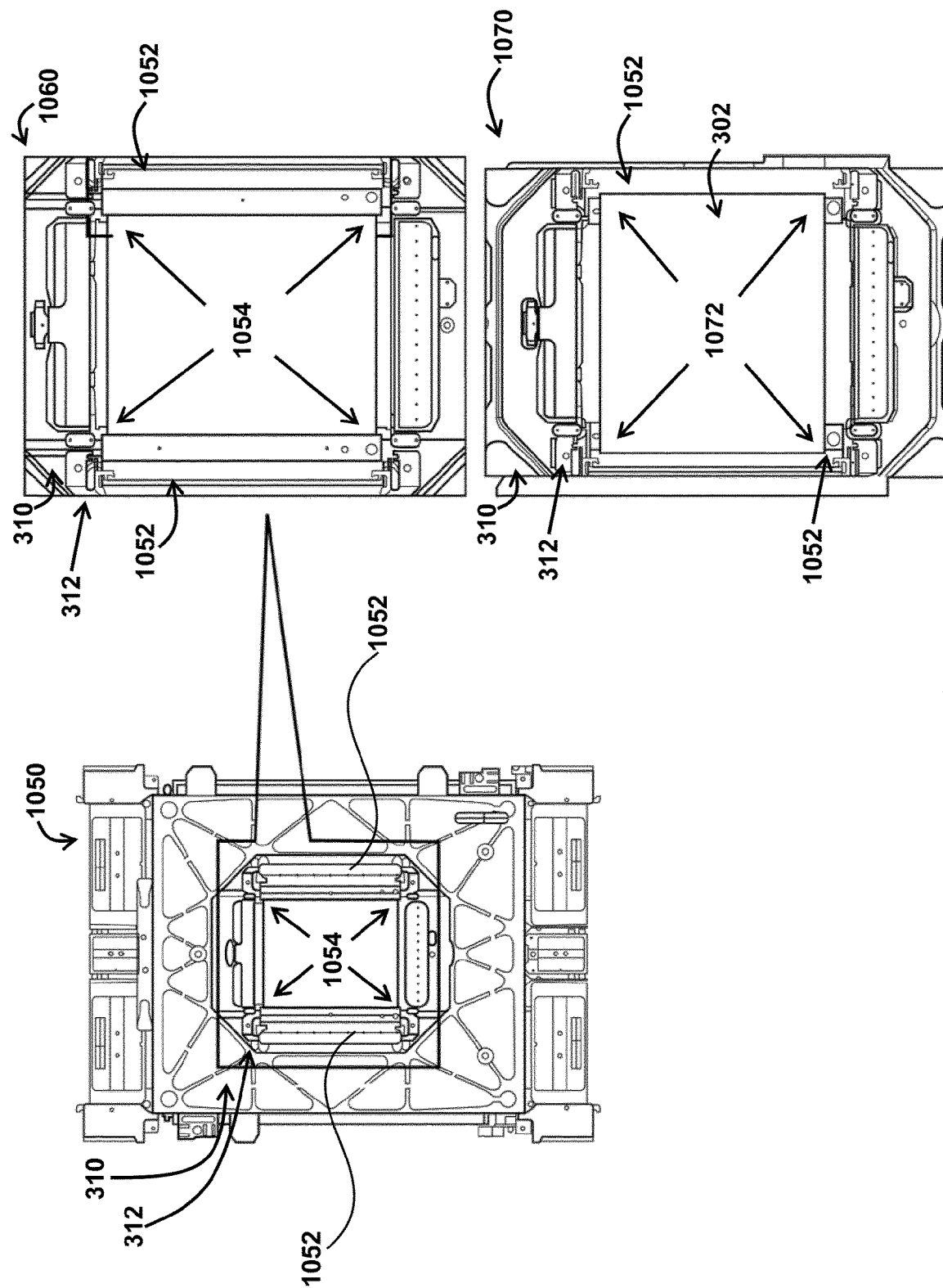
FIG. 10 illustrates overhead views of a reticle stage, reticle clamps, and/or associated membranes, according to an embodiment.

FIG. 10 illustrates overhead views 1050, 1060, and 1070 of reticle stage 310, reticle clamps 312, and/or associated membranes 1052. In some embodiments, clamps 312 and/or associated membranes 1052 may be the target surfaces cleaned by cleaning tool 302, for example. Typically, the membranes 1052 are in contact with the bottom of a reticle, in the areas where a barcode (and/or other identification data) is printed. The printing is applied with chrome, MoSi, or other materials. When the reticle is clamped via vacuum and then scanned (e.g., for identification purposes), the high contact pressure can initiate molecular level bonding between the reticle material and the clamp 312 material. When separated, small portions of the reticle material are pulled out and remain on the surface of the membrane 1052. Hence the need for cleaning. In practice, reticle handler turret gripper 306 (not shown in FIG. 10) would lower (e.g., into the page) cleaning tool (reticle) 302 in its expanded form onto clamps 312 and/or associated membranes 1052.

View 1060 is an enlarged view of a portion of view 1050. Views 1050 and 1060 show the size 1054 of a typical reticle held by clamps 312. View 1070 shows the size 1072 of cleaning tool (e.g., cleaning reticle) 302 (also shown in prior figures) in its expanded configuration. Size 1072 is large enough to contact clamps 312 and/or membranes 1052 for cleaning. Cleaning tool 302 is configured to expand and contract between size 1054 and size 1072, and/or other sizes. In some embodiments, as shown in FIG. 10, cleaning tool 302 is configured to expand in a single dimension (e.g., an "x" or horizontal dimension according to the orientation of FIG. 10). However, in some embodiments, cleaning tool 302 may be configured to expand in more than one dimension (e.g., in "x" and "y" dimensions) to appropriately engage target cleaning surfaces. It should be noted that in contracted size 1054, cleaning tool 302 is configured to fit in container 304 (shown in prior figures) so cleaning tool 302 can be loaded into, and move through, lithographic apparatus 300 in container 304, as a typical reticle would (e.g., via a reticle handler turret gripper 306, reticle handler robot gripper 307, clamps 308, etc.), and/or other components.

Returning to FIG. 7, in some embodiments, container 304 comprises a tray, a pan, and/or other structures. In some embodiments, container 304 is generally rectangular or square in shape, as shown in FIG. 7. In some embodiments, container has a length 722 and/or a width 724 configured such that container 304 fits into lithographic apparatus 300 (FIGS. 3A and 3B) as described above. In some embodiments, container 304 has a base surface 720, side walls 726, and/or other components. In some embodiments, base surface 720 may be substantially planar. In some embodiments, as shown in FIG. 7, base surface 720 may be configured with on or more different depths 730. Depths 730 may accommodate one or more embodiments of cleaning tool 302, for example, such that container 304 holds cleaning tool 302. Depths 730 may be configured such that container 304 fits into lithographic apparatus 300. In some embodiments, container 304 is formed from metal, polymer, a ceramic, and/or other materials.

In some embodiments, container 304 includes one or more contraction components 702 configured to facilitate contraction of cleaning tool 302 from the expanded configuration to the contracted configuration when cleaning tool 302 is returned to container 304 (e.g., as shown in FIG. 6) after the cleaning. In some embodiments, the one or more contraction components 702 comprise a ridge in container 304 configured to push on cleaning tool 302 when cleaning tool 302 is returned to container 304 after the cleaning. In some embodiments, other means of expansion include, but are not limited to, spring loaded assemblies that are actuated by vacuum, pneumatics, electromechanical, and/or other means. Magnets coupled to container 304, cleaning reticle (tool) 302, and/or the turret gripper 306 may be included and provide the motive force to expand and/or contract cleaning reticle 302 via a magnetic field. It should be noted that this description of container 304 is not intended to be limiting. Container 304 may have any shape, with any dimensions and/or features, and be made from any material that allow it to function as described herein.

Figure 11:
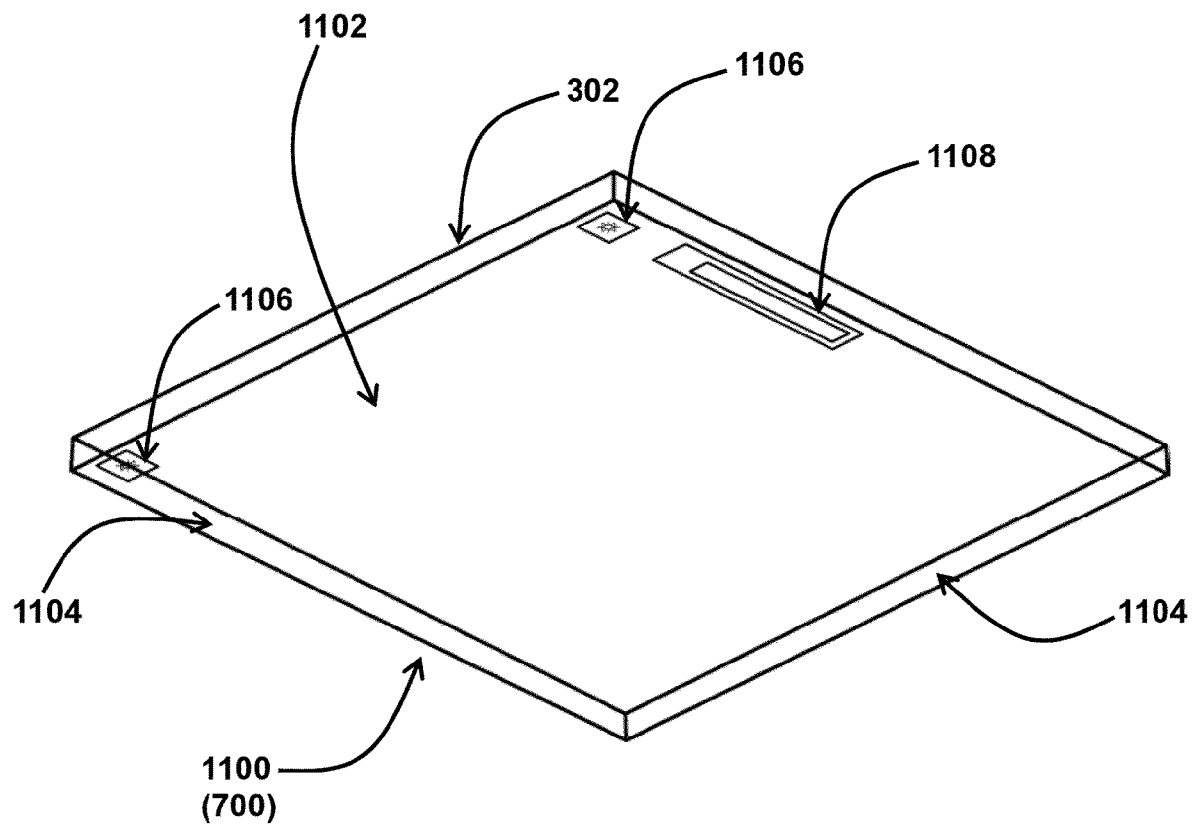
FIG. 11 illustrates an example of cleaning tool (e.g., reticle), according to an embodiment.

FIG. 11 illustrates an example of cleaning tool (e.g., reticle) 302. As described above, in some embodiments, cleaning tool 302 comprises one or more tool handler engagement surfaces and/or cleaning portions having cleaning surfaces that move relative to each other, one or more links coupled by hinged joints, one or more flexible portions, one or more rotating portions, and/or other components configured to facilitate expansion or contraction between the contracted (first) configuration and the expanded (second) configuration. For simplicity and to facilitate the discussion below, FIG. 11 illustrates cleaning tool as a single block of material shaped as a rectangular prism. This is not intended to be limiting. The principles and/or features described below may be applied to the embodiments of cleaning tool 302 shown in FIGS. 3A, 3B, 4, and 6-10, and/or may be included in a separate embodiment of cleaning tool 302.

In some embodiments, one or more portions (e.g., the engagement surfaces, the cleaning portions, etc.) of cleaning tool 302 may be formed from transparent or nearly transparent material such as ultra-low thermal-expansion quartz (SFS) and/or other materials. However, this requirement is for use in lithography. Fabrication of cleaning reticle (tool) 302 can be utilize any number of materials, providing the external dimension and mass conform to the "SEMI standard P1 for Hard Surface Photomask Substrates." In some embodiments, cleaning tool 302 (as shown in FIG. 11) comprises a cleaning surface 1100 (similar to and/or the same as cleaning surfaces 700 described above), an identification surface 1102, one or more side surfaces 1104, and/or other components. The identification surface is on an opposite side of cleaning tool 302 relative to cleaning surface 1100, and below viewing (identification) surface 1102 as shown in FIG. 11. In some embodiments, cleaning tool 302 also includes one or more identification features 1106, 1108. Identification features 1106 and 1108 may include pre-alignment marks 1106, a barcode 1108, and/or other identification features. Cleaning tool 302 is configured such that identification features 1106 and 1108 are visible through identification surface 1102.

In some embodiments, identification features 1106 and 1108 may be located on cleaning surface 1100 as shown in FIG. 11. In such embodiments, cleaning surface 1100 is partially covered by cleaning material. In some embodiments, the cleaning material comprises one or more different materials. The material used for cleaning the membranes can vary, depending on the contamination to be removed. The cleaning material can be permanently applied to the tooling reticle by sputtering/vapor deposition, bonding, and/or other operations. Commercially available cleaning materials used for optics/electronics/medical devices can also be bonded or otherwise attached in a way configured to enable removal and replacement. Examples of materials include, but are not limited to, woven polyester, woven rayon, open or closed cell polyethylene foam. etc., and/or some combination thereof. For removal of 'loose' particles, a 'sticky' surface can be utilized, using a double sided tape, kapton tape, achillies tape, etc. The cleaning material is configured to contact and clean reticle stage 310 (FIGS. 3A and 3B) reticle clamps 312 (FIGS. 3A and 3B), and/or associated membranes as described above. In such embodiments, cleaning surface 1100 may be configured with gaps in the cleaning material that correspond to the locations of identification features 1106 and 1108, for example. The gaps may be created by cutting and/or otherwise removing cleaning material in the areas that correspond to the locations of identification features 1106 and 1108. The gaps in the cleaning material may be left because the cleaning material is generally opaque or nearly opaque, and identification features 1106 and 1108 are configured to be read by a camera in lithographic apparatus 300 (FIGS. 3A and 3B) using illumination that passes into cleaning tool 302 from the cleaning surface 1100 side of cleaning tool 302 and out of cleaning tool 302 through identification surface 1102. Cleaning material that covered all of cleaning surface 1100 would block the illumination from passing into cleaning tool 302 in this embodiment. (It should be noted that it may be possible to use through holes instead of pre-alignment marks 1106, and alleviate the need for gaps in the cleaning material, but not for barcode 1108).

In some embodiments, substantially all of cleaning surface 1100 may be covered with the cleaning material. Advantageously, this maximizes the area cleaned by cleaning surface 1100. In such embodiments, cleaning tool 302 may be configured with an internal source of illumination, and identification features 1106 and 1108 located between cleaning surface 1100 and identification surface 1102, such that identification features 1106 and 1108 are visible through the identification surface using light from the internal source of illumination. For example, in some embodiments, cleaning tool 302 comprises one or more interior surfaces between cleaning surface 1100 identification surface 1102. Identification features 1106 and 1108 may be located on the one or more of these interior surfaces.

By way of a non-limiting example, a layer of glass may form identification surface 1102. This glass layer may be a thin reticle, with identification features 1106 and/or 1108 printed and/or otherwise formed on an inner (cleaning surface 100 facing) side of the glass layer. This may provide a smooth and continuous opposite (or outer) surface 1100 of the glass layer for turret gripper 306 (FIGS. 3A and 3B). A remaining volume of cleaning tool 302 may be filled by assembling a layered structure via bonding, optical contacting, mechanical assembly, and/or other operations to provide other layers and/or an area configured to hold an illumination source for illumination of identification features 1106 and/or 1108. The cleaning material may then be mounted to cleaning tool (e.g., reticle) 302 on any part of cleaning surface 1100 because it does not block illumination needed to read identification features 1106 and/or 1108.

Advantageously, locating identification features 1106, 1108, and/or other features on an interior surface keeps identification surface 1102 smooth and/or continuous for gripping by turret gripper 306 (FIGS. 3A and 3B). For example, turret gripper 306 may require a specific coefficient of friction between feet 600 (FIG. 7-9) and cleaning tool 302 to ensure feet 600 are seated properly when lowered to cleaning tool (e.g., reticle) 302. Turret gripper 306 may also need a continuous surface to seal against when pulling a vacuum to lift and/or otherwise move cleaning tool (e.g., reticle) 302. A smooth identification surface 1102 may resolve these and other issues.

Figure 12:
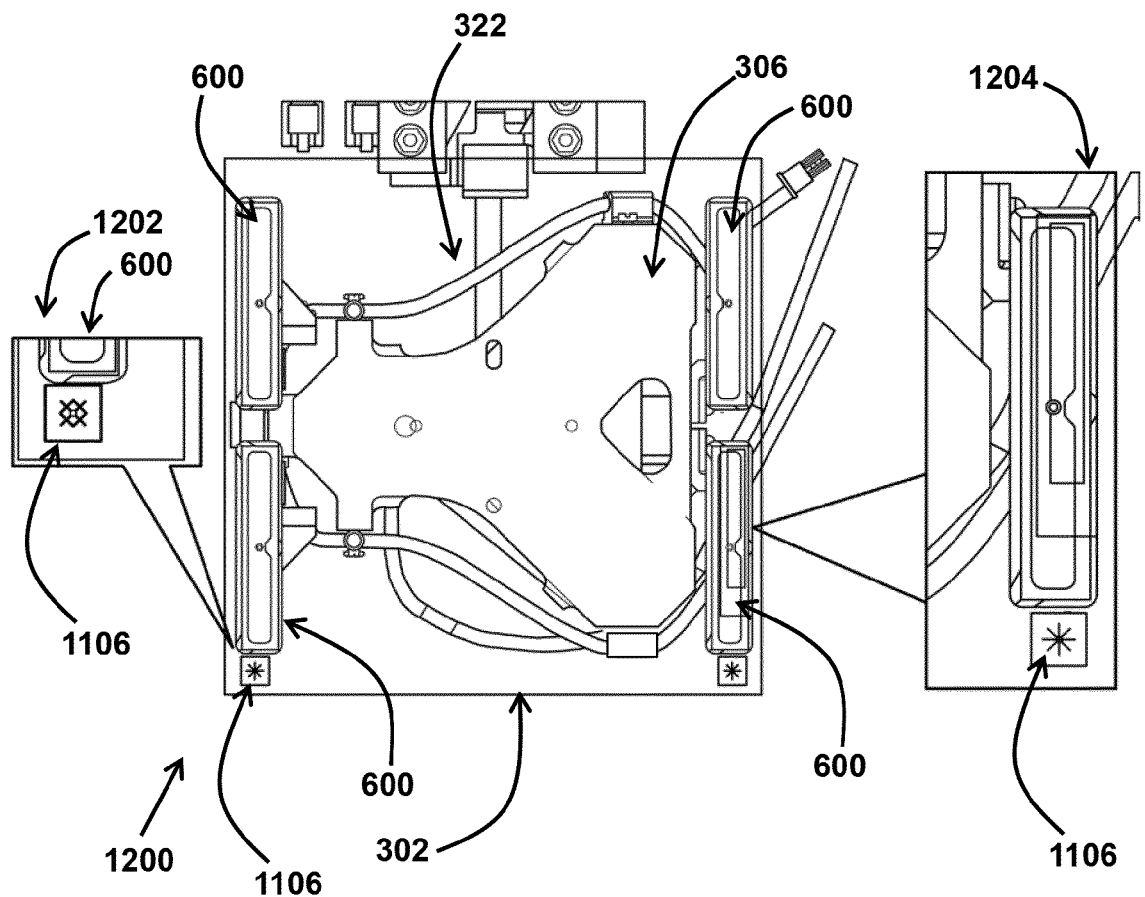
FIG. 12 shows a view of the turret gripper and feet of the turret gripper looking (up) through the cleaning tool, according to an embodiment.

As an illustration, FIG. 12 shows a view 1200 of turret gripper 306 and feet 600 looking (up) through cleaning tool 302. FIG. 12 also shows enlarged views 1202 and 1204 of feet 600 positioned relative to identification features 1106 (as an example). As described above, feet 600 of turret gripper 306 may need a continuous surface to seal against when pulling a vacuum to lift and/or otherwise move cleaning tool (e.g., reticle) 302.

Figure 13:
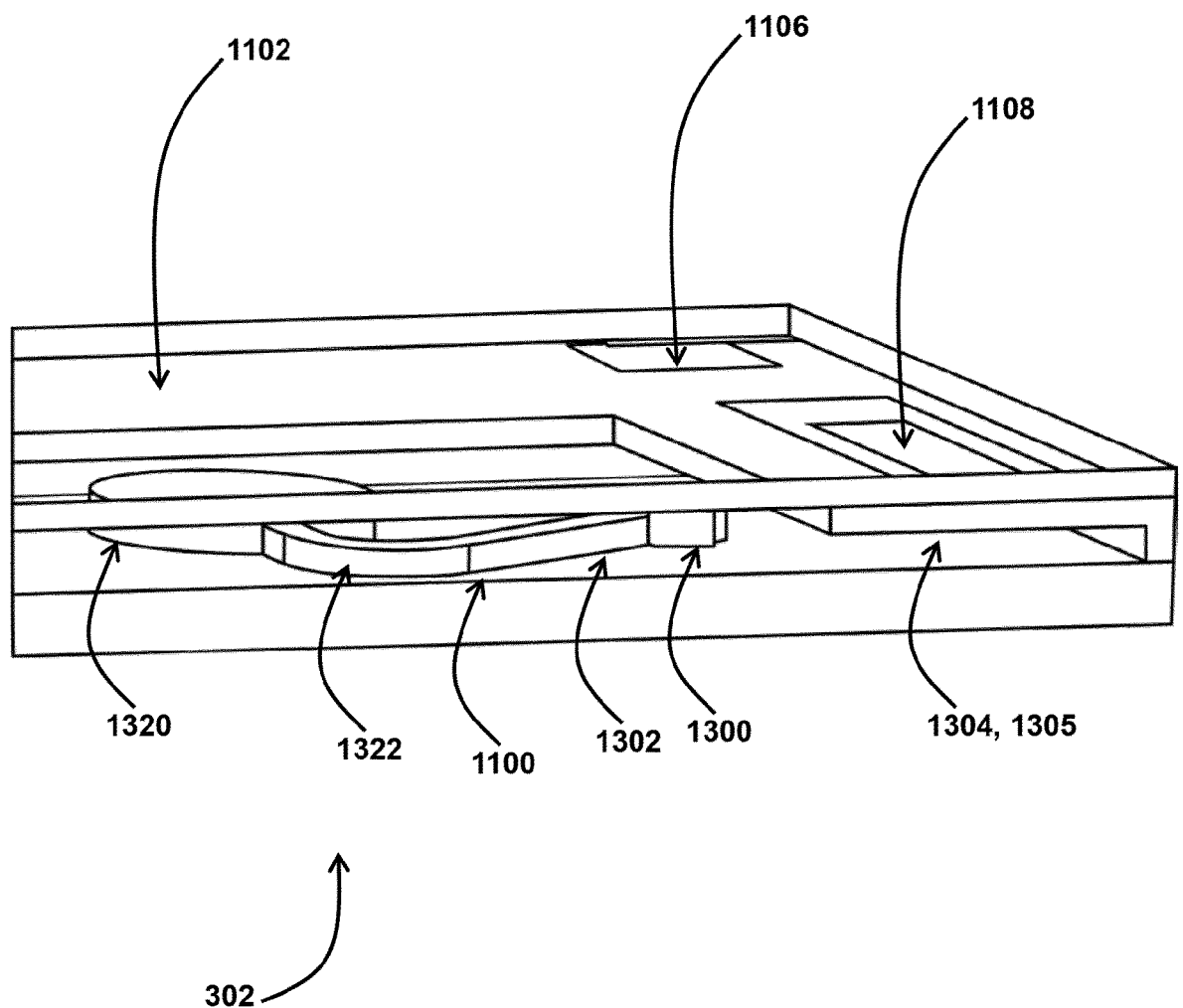
FIG. 13 illustrates an example embodiment of a layered version of the cleaning tool with an illumination source located between a cleaning surface and an identification surface of the cleaning tool in an interior of the cleaning tool, according to an embodiment.

FIG. 13 illustrates an example embodiment of a layered version of cleaning tool 302 with an illumination source 1300 located between cleaning surface 1100 and identification surface 1102 in an interior 1302 of cleaning tool 302. Illumination source 1300 is configured to provide illumination such that the one or more identification features 1106 and/or 1108 are visible through identification surface 1102. In some embodiments, illumination source 1300 comprises a light emitting diode (LED). In some embodiments, illumination source 1300 comprises an illumination guide 1304 configured to guide illumination from the LED toward the one or more identification features 1106 and/or 1108 and through identification surface 1102. For example, as shown in FIG. 13 illumination guide 1304 may include one or more cavities 1305 located proximate to identification features 1106 and/or 1108. Illumination guide 1304 may also include various channels, reflective surfaces, etc. configured to guide light past identification features 1106 and/or 1108 and out through identification surface 1102.

In some embodiments, instead of and/or in addition to an LED, illumination source 1300 may comprise one or more mirrors and/or other reflective surfaces configured to guide ambient light from the ambient atmosphere (e.g., below cleaning tool 302) through interior 1302 of cleaning tool 302 toward the one or more identification features 1106 and/or 1108 and through identification surface 1102. In some embodiments, interior 1302 may include an electrical energy storage device such as a battery 1320 and/or other power sources for illumination source 1300, wiring 1322 coupling battery 1320 to illumination source 1300, a removable access cover configured to provide user access to interior 1302, and/or other components configured to allow cleaning tool 302 to function as described herein. In some embodiments, illumination source 1300 may be and/or include a passive illumination means that may be configured to capture illumination from the center of the reticle (that is not covered) and channel it up through the identification marks via mirrors, lenses, prisms, and/or other optical elements. In some embodiments, illumination can also be provided by 'glow in the dark' paint, or other similar products such as a vial of tritium and/or other materials.

Figure 14:
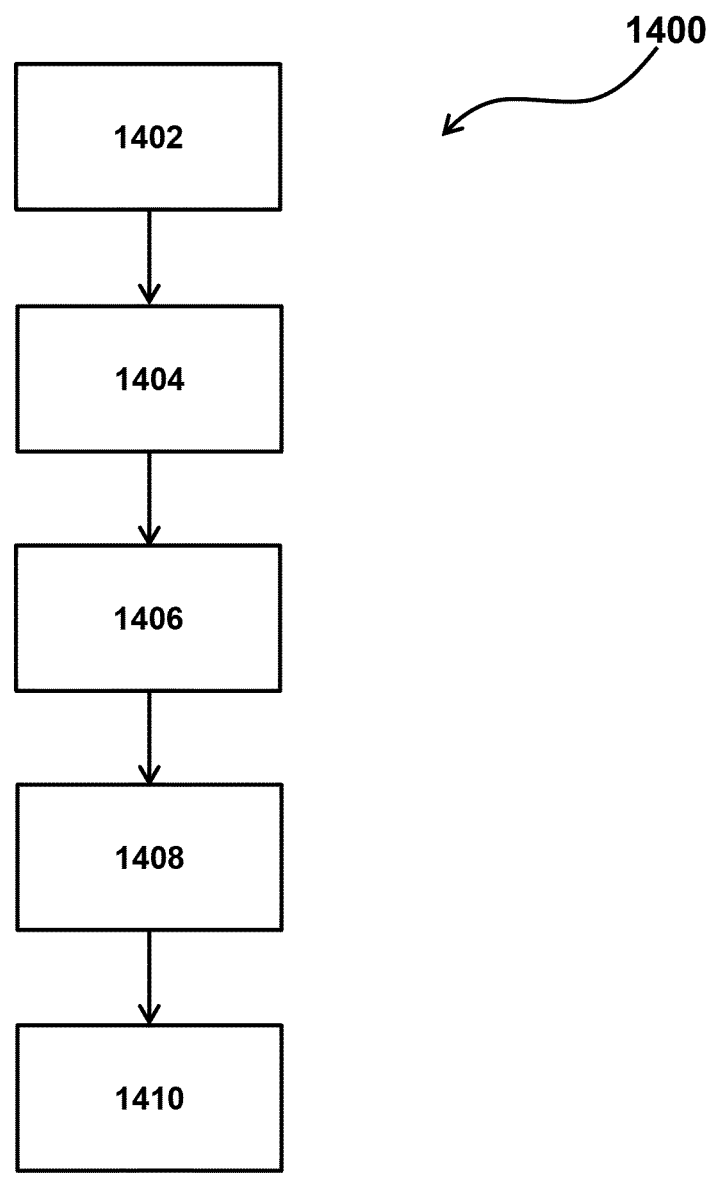
FIG. 14 illustrates a method for cleaning a portion of a lithography apparatus, according to an embodiment.

FIG. 14 illustrates a method 1400 for cleaning a portion of a lithography apparatus. Method 1400 may be performed with a cleaning system, for example. In some embodiments, the cleaning system comprises a cleaning tool, a container, and/or other components. The operations of method 1400 presented below are intended to be illustrative. In some embodiments, method 1400 may be accomplished with one or more additional operations not described, and/or without one or more of the operations discussed. Additionally, the order in which the operations of method 1400 are illustrated in FIG. 14 and described below is not intended to be limiting.

In some embodiments, one or more portions of method 1400 may be implemented in and/or controlled by one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 1400 in response to instructions stored electronically on an electronic storage medium. The one or more processing devices may include one or more devices configured through hardware, firmware, and/or software to be specifically designed for execution of one or more of the operations of method 1400 (e.g., see discussion related to FIG. 15 below). For example, the one or more processing devices may run (e.g., ASML Twinscan) software configured to run a cleaning program that causes one or more of the operations described herein to be performed.

At an operation 1402, the cleaning tool is inserted into the lithography apparatus. In some embodiments, the lithography apparatus is configured for DUV radiation. In some embodiments, the cleaning tool comprises a cleaning reticle. The cleaning tool is in a first contracted configuration when it is inserted into the lithography apparatus. The cleaning tool is in the container when it is inserted into the lithography apparatus. In some embodiments, operation 1402 is performed by a tool handler of the lithography apparatus (e.g., reticle handler robot gripper 307 shown in FIGS. 3A and 3B and described herein) and/or other components.

At an operation 1404, the cleaning tool is engaged and moved by a second portion of the tool handler of the lithography apparatus. In some embodiments, the second portion of the tool handler may be a reticle handler turret gripper and/or other components. In some embodiments, operation 1404 is performed by a reticle handler turret gripper the same as or similar to turret gripper 306 (shown in FIGS. 3A and 3B and described herein).

At operation 1406, the cleaning tool moves from the first configuration to a second, expanded configuration. In some embodiments, operation 1406 occurs responsive to the cleaning tool being lifted out of the container by the second portion of the tool handler (e.g., turret gripper). In some embodiments, the moving is facilitated by one or more links coupled by hinged joints in the cleaning tool configured to facilitate expansion or contraction between the first configuration and the second configuration. In some embodiments, the moving is facilitated by one or more flexible portions of the cleaning tool configured to facilitate expansion or contraction between the first configuration and the second configuration. In some embodiments, the moving is facilitated by one or more rotating portions of the cleaning tool configured to facilitate expansion or contraction between the first configuration and the second configuration. In some embodiments, operation 1406 is performed by the cleaning tool as described above (e.g., cleaning tool 302 as shown in FIGS. 3A and 3B and described herein).

At operation 1408, the cleaning tool is used to clean the portion of the lithography apparatus. The cleaning tool is in the second, expanded, configuration when used for cleaning the portion of the lithography apparatus. In some embodiments, the portion of the lithography apparatus comprises reticle stage reticle clamps. In some embodiments, operation 1408 is performed by the cleaning tool as described above (e.g., cleaning tool 302 as shown in FIGS. 3A and 3B and described herein).

At operation 1410, the cleaning tool is returned back to the container. The cleaning tool is returned back to the container by the second portion of the tool handler. The cleaning tool is configured to move from the second (expanded) configuration to the first (contracted) configuration when the cleaning tool is returned to the container by the second portion of the tool handler after cleaning. In some embodiments, the container comprises one or more contraction components. Operation 1410 comprises facilitating contraction of the cleaning tool from the second configuration to the first configuration when the cleaning tool is returned to the container after the cleaning with the contraction components. Returning the cleaning tool back to the container is performed by the second portion of the tool handler (e.g., the turret gripper). In some embodiments, the second portion of the tool handler may be the same as or similar to turret gripper 306 (shown in FIGS. 3A and 3B and described herein).

In some embodiments, method 1400 comprises (e.g., as described above related to FIG. 11-13) providing a cleaning surface on the cleaning tool that is at least partially covered by cleaning material; providing an identification surface on the cleaning tool, the identification surface being on an opposite side of the cleaning tool relative to the cleaning surface; providing one or more identification features on the cleaning tool, the one or more identification features located between the cleaning surface and the identification surface on one or more interior surfaces of the cleaning tool, the one or more identification features visible through the identification surface; providing an illumination source located between the cleaning surface and the identification surface in an interior of the cleaning tool, the illumination source configured to provide illumination such that the one or more identification features are visible through the identification surface; and/or other operations.

Figure 15:
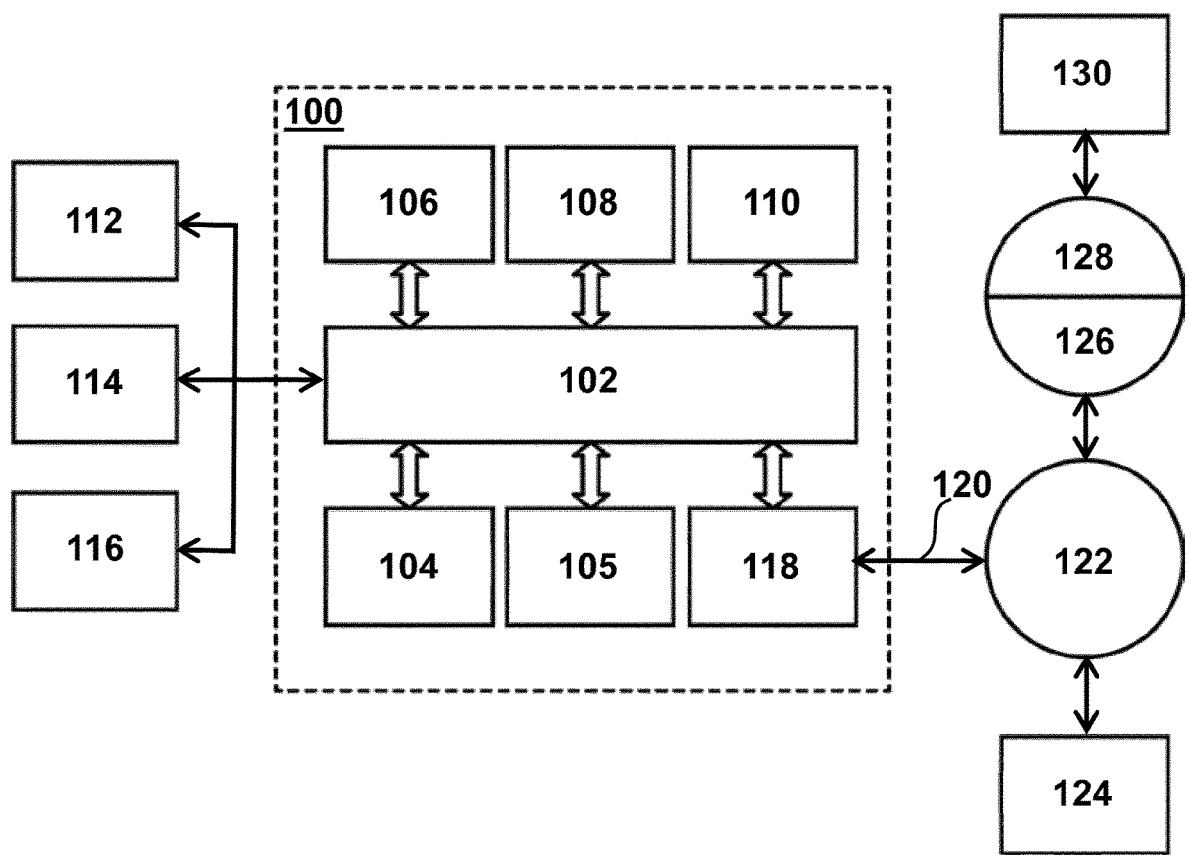
FIG. 15 is a block diagram of an example computer system, according to an embodiment.

FIG. 15 is a block diagram that illustrates a computer system 100 that can assist in implementing the methods, flows, or the system(s) disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 16:
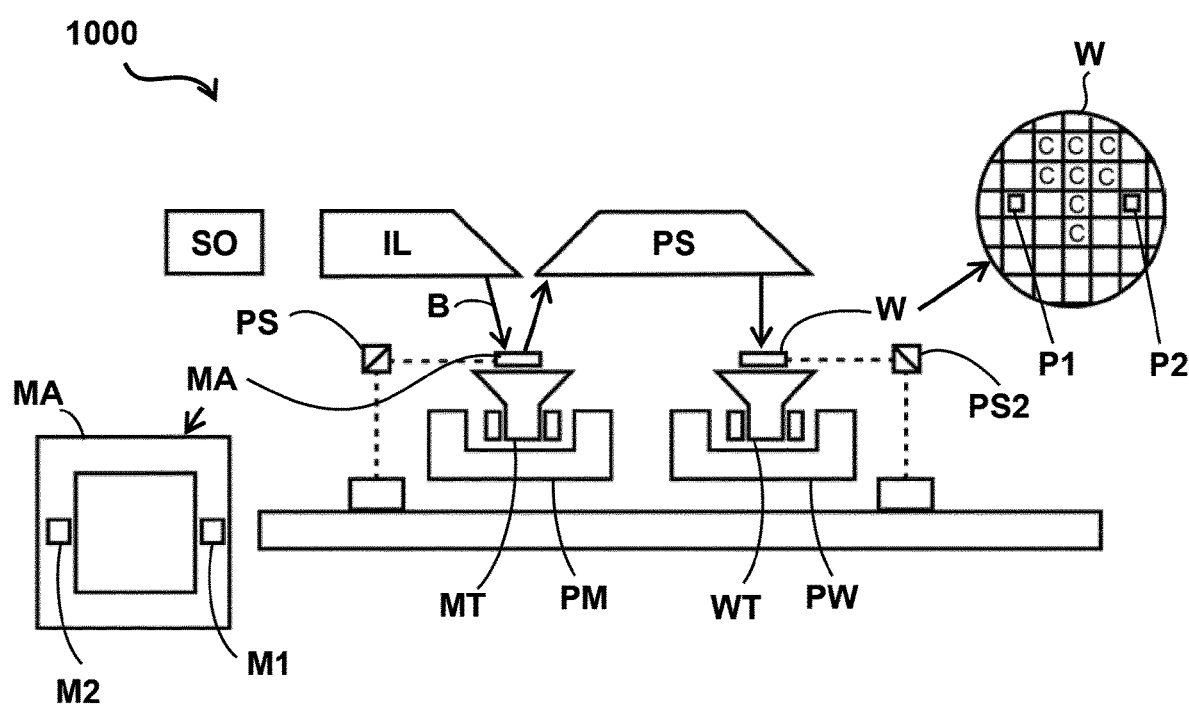
FIG. 16 is a schematic diagram of a lithographic projection apparatus similar to FIG. 1, according to an embodiment.

FIG. 16 schematically depicts an exemplary lithographic projection apparatus 1000 similar to and/or the same as the apparatus shown in FIG. 1, FIG. 3A, and/or FIG. 3B that can be used in conjunction with the techniques described herein. Apparatus 1000 may generally represent a DUV apparatus, for example, with a twin scan setup (this example is not intended to be limiting). The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means for setting the outer and/or inner radial extent (commonly referred to as 6-outer and 6-inner, respectively) of the intensity distribution in the beam. In addition, it will generally comprise various other components, such as an integrator and a condenser. In this way, the beam B impinging on the patterning device MA has a desired uniformity and intensity distribution in its cross-section.

It should be noted with regard to FIG. 16 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means), the substrate table WT can be moved accurately, e.g. to position different target portions C in the path of the beam. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one operation (i.e., a single "flash") onto a target portion C. The substrate table WT is then shifted in the x and/or y directions so that a different target portion C can be irradiated by the beam;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The embodiments may further be described using the following clauses:

1. A system for cleaning a portion of a lithography apparatus, the system comprising:
   a cleaning tool, the cleaning tool configured to be inserted into the lithography apparatus in a first configuration, engaged by a tool handler of the lithography apparatus, and used for cleaning the portion of the lithography apparatus;
   wherein the cleaning tool is configured to move from the first configuration to a second, expanded configuration, after engagement by the tool handler such that the cleaning tool is in the second configuration when used for cleaning the portion of the lithography apparatus.
2. The system of clause 1, further comprising a container configured to hold the cleaning tool in the first configuration and fit into the lithography apparatus, wherein the cleaning tool is configured to be inserted into the lithography apparatus in the container, moved from the container by the tool handler for the cleaning, and returned to the container by the tool handler after the cleaning.
3. The system of clause 2, wherein the cleaning tool is configured to move from the first configuration to the second configuration when the cleaning tool is moved from the container by the tool handler for cleaning.
4. The system of any of clauses 2-3, wherein the cleaning tool is configured to move from the second configuration to the first configuration when the cleaning tool is returned to the container by the tool handler after cleaning.
5. The system of any of clauses 2-4, wherein the container comprises one or more contraction components configured to facilitate contraction of the cleaning tool from the second configuration to the first configuration when the cleaning tool is returned to the container after the cleaning.
6. The system of clause 5, wherein the one or more contraction components comprise a ridge in the container configured to push on the cleaning tool when the cleaning tool is returned to the container after the cleaning.
7. The system of any of clauses 1-6, wherein the portion of the lithography apparatus comprises reticle stage reticle clamps.
8. The system of any of clauses 1-7, wherein the cleaning tool comprises a cleaning reticle.
9. The system of any of clauses 1-8, wherein the tool handler comprises a reticle handler turret gripper.
10. The system of any of clauses 1-9, wherein the lithography apparatus is configured for deep ultra violet (DUV) radiation.
11. The system of any of clauses 1-10, wherein the first configuration comprises a contracted configuration relative to the second configuration.
12. The system of any of clauses 1-11, wherein the cleaning tool comprises one or more links coupled by hinged joints configured to facilitate expansion or contraction between the first configuration and the second configuration.
13. The system of any of clauses 1-12, wherein the cleaning tool comprises one or more flexible portions configured to facilitate expansion or contraction between the first configuration and the second configuration.
14. The system of any of clauses 1-13, wherein the cleaning tool comprises one or more rotating portions configured to facilitate expansion or contraction between the first configuration and the second configuration.
15. The system of any of clauses 1-14, wherein the cleaning tool further comprises one or more tool handler engagement surfaces configured to remain in a position and orientation that corresponds to the tool handler whether the cleaning tool is in the first configuration or the second configuration.
16. The system of clause 15, wherein the cleaning tool further comprises one or more cleaning surfaces configured to move relative to the one or more tool handler engagement surfaces when the cleaning tool moves between the first and second configurations.
17. The system of clause 16, wherein the one or more cleaning surfaces are configured to contact one or more target surfaces of the portion of the lithography apparatus for cleaning when the cleaning tool is in the second configuration.
18. The system of clause 17, wherein the one or more cleaning surfaces are configured to be parallel to the one or more target surfaces when the cleaning tool is in the second configuration.
19. The system of clause 18, wherein the one or more target surfaces comprise one or more membrane surfaces of the lithography apparatus.
20. The system of any of clauses 1-19, wherein the cleaning tool comprises:
   a cleaning surface at least partially covered by cleaning material;
   an identification surface, the identification surface being on an opposite side of the cleaning tool relative to the cleaning surface; and
   one or more identification features located between the cleaning surface and the identification surface, the one or more identification features visible through the identification surface.
21. The system of clause 20, wherein the cleaning surface is opaque, and the identification surface is transparent.
22. The system of any of clauses 20-21, wherein the cleaning tool further comprises one or more interior surfaces between the cleaning surface and the identification surface, and wherein the one or more identification features are located on the one or more interior surfaces.
23. The system of any of clauses 20-22, wherein the one or more identification features comprise one or both of a bar code and an alignment mark.
24. The system of any of clauses 20-23, wherein the cleaning tool further comprises an illumination source located between the cleaning surface and the identification surface in an interior of the cleaning tool, the illumination source configured to provide illumination such that the one or more identification features are visible through the identification surface.

25. The system of clause 24, wherein the illumination source comprises a light emitting diode (LED).

26. The system of clause 25, wherein the illumination source further comprises an illumination guide configured to guide illumination from the LED toward the one or more identification features and through the identification surface.

27. The system of clause 24, wherein the illumination source comprises one or more mirrors configured to guide ambient light from below the cleaning tool through an interior of the cleaning tool toward the one or more identification features and through the identification surface.

28. A method for cleaning a portion of a lithography apparatus with a cleaning tool, the method comprising:
   inserting the cleaning tool into the lithography apparatus in a first configuration,
   engaging the cleaning tool with a tool handler of the lithography apparatus;
   moving the cleaning tool from the first configuration to a second, expanded configuration; and
   cleaning the portion of the lithography apparatus with the cleaning tool while the cleaning tool is in the second, expanded configuration.

29. The method of clause 28, further comprising holding the cleaning tool in the first configuration in a container, and inserting the cleaning tool into the lithography apparatus in the container, moving the cleaning tool from the container with the tool handler for the cleaning, and returning the cleaning tool to the container with the tool handler after the cleaning.

30. The method of clause 29, further comprising moving the cleaning tool from the first configuration to the second configuration when the cleaning tool is moved from the container by the tool handler for cleaning.

31. The method of any of clauses 28-30, further comprising moving the cleaning tool from the second configuration to the first configuration when the cleaning tool is returned to the container by the tool handler after cleaning.

32. The method of any of clauses 28-31, further comprising contracting the cleaning tool from the second, expanded configuration in response to the cleaning tool being returned to the container after the cleaning with the contraction components.

33. The method of any of clauses 28-32, wherein the portion of the lithography apparatus comprises reticle stage reticle clamps.

34. The method of any of clauses 28-34, wherein the cleaning tool comprises a cleaning reticle.

35. The method of any of clauses 28-34, wherein the tool handler comprises a reticle handler turret gripper.

36. The method of any of clauses 28-35, wherein the lithography apparatus is configured for deep ultra violet (DUV) radiation.

37. The method of any of clauses 28-36, wherein the moving is facilitated by one or more links coupled by hinged joints in the cleaning tool configured to facilitate expansion or contraction between the first configuration and the second configuration.

38. The method of any of clauses 28-37, wherein the moving is facilitated by one or more flexible portions of the cleaning tool configured to facilitate expansion or contraction between the first configuration and the second configuration.

39. The method of any of clauses 28-38, wherein the moving is facilitated by one or more rotating portions of the cleaning tool configured to facilitate expansion or contraction between the first configuration and the second configuration.

40. The method of any of clauses 28-39, further comprising:
   providing a cleaning surface on the cleaning tool that is at least partially covered by cleaning material;
   providing an identification surface on the cleaning tool, the identification surface being on an opposite side of the cleaning tool relative to the cleaning surface;
   providing one or more identification features on the cleaning tool, the one or more identification features located between the cleaning surface and the identification surface on one or more interior surfaces of the cleaning tool, the one or more identification features visible through the identification surface; and.
   providing an illumination source located between the cleaning surface and the identification surface in an interior of the cleaning tool, the illumination source configured to provide illumination such that the one or more identification features are visible through the identification surface.

41. A computer program product comprising a non-transitory computer readable medium having instructions recorded thereon, the instructions when executed by a computer implementing the method of any of clauses 28-40.

While the concepts disclosed herein may be used for wafer manufacturing on a substrate such as a silicon wafer, it shall be understood that the disclosed concepts may be used with any type of manufacturing system, e.g., those used for manufacturing on substrates other than silicon wafers. In addition, the combination and sub-combinations of disclosed elements may comprise separate embodiments. For example, the expanding and contracting cleaning tool (FIG. 3A-10), and the internally illuminated cleaning too (e.g., FIG. 11-13) may comprise separate embodiments, and/or these features may be used together in the same embodiment.

The descriptions above are intended to be illustrative, not limiting. Thus, it will be apparent to one skilled in the art that modifications may be made as described without departing from the scope of the claims set out below.

The invention claimed is:

1. A system for cleaning a portion of a lithography apparatus, the system comprising:
   a cleaning tool, the cleaning tool configured to be inserted into the lithography apparatus in a first configuration, configured to be engaged by a handler of the lithography apparatus, and used for cleaning the portion of the lithography apparatus;
   wherein the cleaning tool is configured to move from the first configuration to a second, expanded configuration, after engagement by the handler, and prior to any contact of the cleaning tool with the portion, such that the cleaning tool is in the second configuration when used for cleaning the portion of the lithography apparatus.

2. The system of claim 1, further comprising a container configured to hold the cleaning tool in the first configuration and fit into the lithography apparatus, wherein the cleaning tool is configured to be inserted into the lithography apparatus in the container, moved from the container by the handler for the cleaning, and returned to the container by the handler after the cleaning.

3. The system of claim 2, wherein the cleaning tool is configured to move from the first configuration to the second configuration when the cleaning tool is moved from the container by the handler for cleaning.

4. The system of claim 2, wherein the cleaning tool is configured to move from the second configuration to the first configuration when the cleaning tool is returned to the container by the handler after cleaning.

5. The system of claim 2, wherein the container comprises one or more contraction components configured to facilitate contraction of the cleaning tool from the second configuration to the first configuration when the cleaning tool is returned to the container after the cleaning.

6. The system of claim 5, wherein the one or more contraction components comprise a ridge in the container configured to push on the cleaning tool when the cleaning tool is returned to the container after the cleaning.

7. The system of claim 1, wherein the portion of the lithography apparatus comprises a reticle stage reticle clamp.

8. The system of claim 1, wherein the cleaning tool comprises a cleaning reticle.

9. The system of claim 1, wherein the handler comprises a reticle handler turret gripper.

10. The system of claim 1, wherein the lithography apparatus is configured for deep ultra violet (DUV) radiation.

11. The system of claim 1, wherein the first configuration comprises a contracted configuration relative to the second configuration.

12. The system of claim 1, wherein the cleaning tool comprises one or more links coupled by hinged joints configured to facilitate expansion or contraction between the first configuration and the second configuration.

13. The system of claim 1, wherein the cleaning tool comprises one or more flexible portions configured to facilitate expansion or contraction between the first configuration and the second configuration.

14. The system of claim 1, wherein the cleaning tool comprises one or more rotating portions configured to facilitate expansion or contraction between the first configuration and the second configuration.

15. The system of claim 1, wherein the cleaning tool further comprises one or more handler engagement surfaces configured to remain in a position and orientation that corresponds to the handler whether the cleaning tool is in the first configuration or the second configuration.

16. The system of claim 15, wherein the cleaning tool further comprises one or more cleaning surfaces configured to move relative to the one or more tool engagement surfaces when the cleaning tool moves between the first and second configurations.

17. The system of claim 16, wherein the one or more cleaning surfaces are configured to contact one or more target surfaces of the portion of the lithography apparatus for cleaning when the cleaning tool is in the second configuration.

18. The system of claim 17, wherein the one or more cleaning surfaces are configured to be parallel to the one or more target surfaces when the cleaning tool is in the second configuration.

19. The system of claim 17, wherein the one or more target surfaces comprise one or more membrane surfaces of the lithography apparatus.

20. The system of claim 1, wherein the cleaning tool comprises:
   a cleaning surface at least partially covered by cleaning material;
   an identification surface, the identification surface being on an opposite side of the cleaning tool relative to the cleaning surface; and
   one or more identification features located between the cleaning surface and the identification surface, the one or more identification features visible through the identification surface.

* * * * *